US011349019B2

(12) United States Patent
Naito

(10) Patent No.: US 11,349,019 B2
(45) Date of Patent: May 31, 2022

(54) SEMICONDUCTOR DEVICE WITH AN EXPANDED DOPING CONCENTRATION DISTRIBUTION IN AN ACCUMULATION REGION

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 45 days.

(21) Appl. No.: 16/735,704

(22) Filed: Jan. 7, 2020

(65) Prior Publication Data
US 2020/0152778 A1 May 14, 2020

Related U.S. Application Data

(63) Continuation of application No. PCT/JP2019/000344, filed on Jan. 9, 2019.

(30) Foreign Application Priority Data

Jan. 17, 2018 (JP) .............................. JP2018-006004

(51) Int. Cl.
*H01L 29/739* (2006.01)
*H01L 29/10* (2006.01)
*H01L 29/36* (2006.01)

(52) U.S. Cl.
CPC ...... *H01L 29/7397* (2013.01); *H01L 29/1095* (2013.01); *H01L 29/36* (2013.01)

(58) Field of Classification Search
CPC .. H01L 29/7397; H01L 29/1095; H01L 29/36
(Continued)

(56) References Cited

U.S. PATENT DOCUMENTS 9,190,503 B2 * 11/2015 Senoo ................. H01L 29/6634
2001/0045566 A1   11/2001 Takahashi
(Continued)

FOREIGN PATENT DOCUMENTS

JP    H09139510 A    5/1997
JP    2005347289 A   12/2005
(Continued)

OTHER PUBLICATIONS

Office Action issued for counterpart Japanese Application No. 2019-566431, issued by the Japanese Patent Office dated Apr. 6, 2021 (drafted on Mar. 30, 2021).
(Continued)

*Primary Examiner* — Robert T Huber

(57) ABSTRACT

A doping concentration distribution in an accumulation region in a depth direction of a semiconductor substrate has a maximum portion at which a doping concentration reaches a maximum value, an upper gradient portion in which the concentration decreases from the maximum portion to a base region, and a lower gradient portion in which the concentration decreases from the maximum portion to a drift region. When a full width at half maximum determined by setting a depth position of the maximum portion as a range of impurity implantation with reference to a range-full width at half maximum characteristic according to a material of the substrate and a type of impurities contained in the accumulation region is set as a standard full width at half maximum, a full width at half maximum of the distribution in the accumulation region is 2.2 times the standard full width at half maximum or greater.

9 Claims, 15 Drawing Sheets

(58) Field of Classification Search
USPC .................................. 257/139, 586, 577, 592
See application file for complete search history.

(56) References Cited

U.S. PATENT DOCUMENTS

| | | |
|---|---|---|
| 2005/0263853 A1 | 12/2005 | Tomomatsu |
| 2007/0267663 A1 | 11/2007 | Harada |
| 2008/0197379 A1 | 8/2008 | Aono |
| 2015/0243749 A1 | 8/2015 | Kurokawa |
| 2016/0211334 A1 | 7/2016 | Tanaka |
| 2017/0025410 A1 | 1/2017 | Cheng |

FOREIGN PATENT DOCUMENTS

| | | | |
|---|---|---|---|
| JP | 2007311627 | A | 11/2007 |
| JP | 2008205015 | A | 9/2008 |
| JP | 2014061075 | A | 4/2014 |
| JP | 2015135954 | A | 7/2015 |
| JP | 2015138884 | A | 7/2015 |
| WO | 2014061075 | A1 | 4/2014 |
| WO | 2015049815 | A1 | 4/2015 |

OTHER PUBLICATIONS

International Search Report and (ISA/237) Written Opinion of the International Search Authority for International Patent Application No. PCT/JP2019/000344, mailed by the Japan Patent Office dated Mar. 19, 2019.
James F. Ziegler et al., "SRIM—The Stopping and Range of Ions in Matter (2010)", Web Science Conference, 2009WebSci'09: Society On-Line Athens, Greece, Mar. 18-20, 2009, Internet (URL: http://www.srim.org/), p. 1-14.

* cited by examiner

SEMICONDUCTOR DEVICE WITH AN EXPANDED DOPING CONCENTRATION DISTRIBUTION IN AN ACCUMULATION REGION

The contents of the following Japanese patent applications are incorporated herein by reference:
NO. 2018-006004 filed in JP on Jan. 17, 2018, and
NO. PCT/JP2019/000344 filed on Jan. 9, 2019.

BACKGROUND

1. Technical Field

The present invention relates to a semiconductor device.

2. Related Art

In the related art, a semiconductor device such as an insulated gate bipolar transistor (IGBT) is known (for example, refer to Patent Documents 1 to 3). Also, a method of calculating a range of ion implantation is known (for example, refer to Non-Patent Document 1)
Patent Document 1: Japanese Patent Application Publication No. 2007-311627
Patent Document 2: Japanese translation publication of a PCT rout patent application No. 2014-61075
Patent Document 3: Japanese Patent Application Publication No. 2015-138884
Non-Patent Document 1: James F. Ziegler, "SRIM-The Stopping and Range of Ions in Matter", Internet (URL: http://www.srim.org/)

SUMMARY

In the semiconductor device, it is preferably to improve characteristics such as turn-on loss.

A first aspect of the present invention provides a semiconductor device including a semiconductor substrate having a first conductivity-type drift region. The semiconductor device may include a first conductivity-type emitter region provided above the drift region in the semiconductor substrate and having a doping concentration higher than that of the drift region. The semiconductor device may include a second conductivity-type base region provided between the emitter region and the drift region in the semiconductor substrate. The semiconductor device may include a first conductivity-type accumulation region provided between the base region and the drift region in the semiconductor substrate and having a doping concentration higher than that of the drift region. The semiconductor device may include a plurality of trench parts formed to penetrate the emitter region, the base region and the accumulation region from an upper surface of the semiconductor substrate and each having a conductive portion provided therein. A doping concentration distribution in the accumulation region in a depth direction of the semiconductor substrate may have a maximum portion at which the doping concentration reaches a maximum value. The doping concentration distribution may have an upper gradient portion in which the doping concentration has a gradient to decrease in at least a part of a region from the maximum portion to the base region as moving toward the base region. The doping concentration distribution may have a lower gradient portion in which the doping concentration has a gradient to decrease in at least a part of a region from the maximum portion to the drift region as moving toward the drift region. When a full width at half maximum determined by setting a depth position of the maximum portion as a range of impurity implantation with reference to a range-full width at half maximum characteristic according to a material of the semiconductor substrate and a type of impurities contained in the accumulation region is set as a standard full width at half maximum, a full width at half maximum of the doping concentration distribution in the accumulation region may be 2.2 times the standard full width at half maximum or greater.

A sum of a distance from the upper surface of the semiconductor substrate to the maximum portion of the accumulation region and a half width at half maximum of the doping concentration distribution in the accumulation region may be equal to or smaller than a distance from the upper surface of the semiconductor substrate to a lower end of each trench part in the depth direction of the semiconductor substrate.

The full width at half maximum of the doping concentration distribution in the accumulation region may be 30 times the standard full width at half maximum or smaller.

When the semiconductor substrate is a silicon substrate and the impurities contained in the accumulation region is phosphorus, the range-full width at half maximum characteristic may be expressed by a following equation, $$y = 0.01763x^6 - 0.11077x^5 + 0.15065x^4 + 0.21668x^3 - 0.30410x^2 + 0.39392x - 0.77003,$$

where x is a common logarithm of the range (μm), and y is a common logarithm of the full width at half maximum (μm).

The doping concentration in the accumulation region may have a gradient to decrease in an entire region from the maximum portion to the base region as moving toward the base region. The doping concentration in the accumulation region may have a gradient to decrease in an entire region from the maximum portion to the drift region as moving toward the drift region.

The doping concentration distribution in the accumulation region may have a kink portion at which a differential value of the doping concentration distribution exhibits an extreme value in a region except a region in which the differential value exhibits a maximum value or a minimum value.

One of the maximum portion and the kink portion may be arranged in a region above a center of the accumulation region in the depth direction, and the other of the maximum portion and the kink portion may be arranged in a region below the center of the accumulation region in the depth direction.

A doping concentration at the kink portion may be 1/10 of the doping concentration at the maximum portion or greater.

The accumulation region and the base region may be in contact with each other.

A distance from a depth position, at which a ratio of a doping concentration to a doping concentration of the maximum portion is 1/4, to a depth position, at which the ratio is 1/40, in the doping concentration distribution in the accumulation region, may be between 0.1 μm and 1.0 μm, inclusive. The maximum portion of the doping concentration distribution in the accumulation region may be substantially flat.

A second aspect of the present invention provides a semiconductor device including a semiconductor substrate having a first conductivity-type drift region. The semiconductor device may include a first conductivity-type emitter region provided above the drift region in the semiconductor substrate and having a doping concentration higher than that of the drift region. The semiconductor device may include a second conductivity-type base region provided between the emitter region and the drift region in the semiconductor substrate. The semiconductor device may include a first conductivity-type accumulation region provided between the base region and the drift region in the semiconductor substrate and having a doping concentration higher than that of the drift region. The semiconductor device may include a plurality of trench parts formed to penetrate the emitter region, the base region and the accumulation region from an upper surface of the semiconductor substrate and each having a conductive portion provided therein. A doping concentration distribution in the accumulation region in a depth direction of the semiconductor substrate may have a maximum portion at which the doping concentration reaches a maximum value. The doping concentration distribution may have an upper gradient portion in which the doping concentration has a gradient to decrease in at least a part of a region from the maximum portion to the base region as moving toward the base region. The doping concentration distribution may have a lower gradient portion in which the doping concentration has a gradient to decrease in at least a part of a region from the maximum portion to the drift region as moving toward the drift region. The doping concentration distribution may have a kink portion at which a differential value of the doping concentration distribution exhibits an extreme value in a region except a region in which the differential value exhibits a maximum value or a minimum value.

The summary of the present invention does not necessarily describe all necessary features of the present invention. The present invention may also be a sub-combination of the features described above.

DESCRIPTION OF EXEMPLARY EMBODIMENTS

Hereinbelow, embodiments of the present invention will be described. However, the embodiments do not limit the invention defined in the claims. Also, all combinations of features described in the embodiments are not necessarily essential to solving means of the invention.

As used herein, one side in a direction parallel to a depth direction of a semiconductor substrate is referred to as 'upper' and the other side is referred to as 'lower'. One surface of two principal surfaces of a substrate, a layer or other member is referred to as 'upper surface', and the other surface is referred to as 'lower surface'. The 'upper' and 'lower' directions are not limited to a gravity direction or a mounting direction of a semiconductor device to a substrate and the like when mounting the same.

As used herein, the technical matters may be described using orthogonal coordinates axes of X-axis, Y-axis and Z-axis, in many cases. As used herein, a plane parallel to the upper surface of the semiconductor substrate is defined as 'XY plane', and a depth direction perpendicular to the upper surface of the semiconductor substrate is defined as 'Z-axis'.

In each embodiment, an example in which a first conductivity-type is N type and a second conductivity-type is P type is described. However, the first conductivity-type may be P type and the second conductivity-type may be N type. In this case, the conductivity types of the substrate, layers, regions, and the like in each embodiment are reversed. Also, as used herein, P+ type (or N+ type) means that a doping concentration is higher than that of P type (or N type), and P− type (or N− type) means that a doping concentration is lower than that of P type (or N type).

As used herein, the doping concentration refers to a concentration of impurities transformed to donors or acceptors. As used herein, there is a case in which a difference between concentrations of the donors and acceptors (i.e., net doping concentration) is defined as the doping concentration. In this case, the doping concentration can be measured by an SR method. Also, a chemical concentration of the donors or the acceptors may be defined as the doping concentration, In this case, the doping concentration can be measured by a SIMS method. Unless specifically limited, any of the above may be used as the doping concentration. Also, there is a case in which a peak value of the doping concentration distribution in a doping region is defined as the doping concentration in the doping region.

Figure 1:
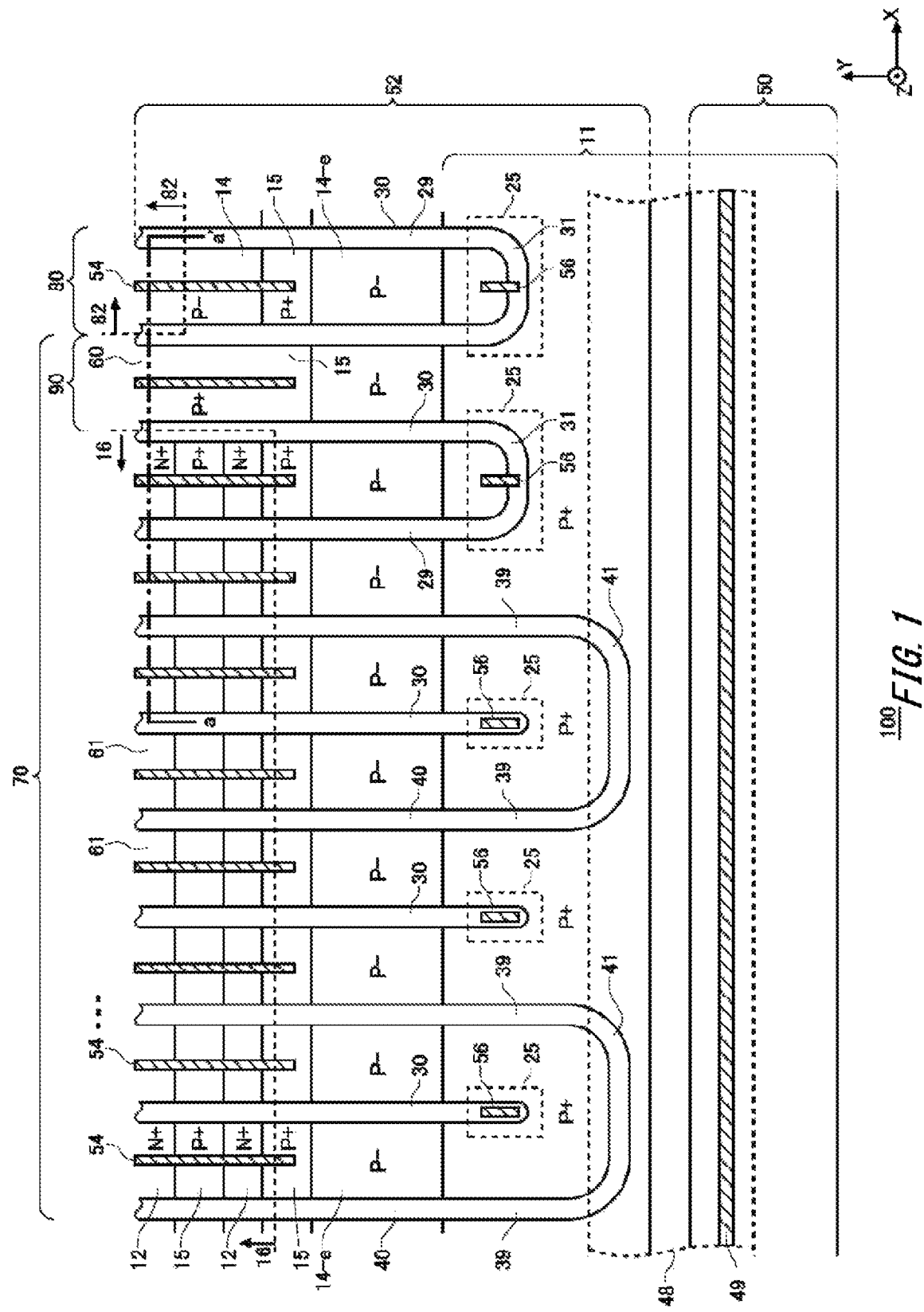
FIG. 1 shows partially an upper surface of a semiconductor device 100 in accordance with an embodiment of the present invention.

FIG. 1 shows partially an upper surface of a semiconductor device 100 in accordance with an embodiment of the present invention. The semiconductor device 100 of the present example is a semiconductor chip including a transistor section 70 including a transistor such as an IGBT, and a diode section 80 including a diode such as an FWD (Free Wheel Diode). The diode section 80 is provided side by side with the transistor section 70 in a predetermined array direction (the X-axis direction, in FIG. 1) on the upper surface of the semiconductor substrate. The diode section 80 and the transistor section 70 may be alternately arranged in the array direction. In FIG. 1, a chip upper surface around a chip end portion is shown, and the other regions are omitted.

Although FIG. 1 shows an active region of the semiconductor substrate of the semiconductor device 100, the semiconductor device 100 may have an edge termination structure part surrounding the active region. The active region refers to a region in which current flows between the upper surface and the lower surface of the semiconductor substrate when the semiconductor device 100 is turned on. The edge termination structure part reduces electric field concentration on the upper surface side of the semiconductor substrate. The edge termination structure part includes, for example, a guard ring, field plate, RESURF structure, or a combination thereof.

The semiconductor device 100 of the present example includes gate trench parts 40, dummy trench parts 30, a well region 11, emitter regions 12, base regions 14, and contact regions 15, which are provided inside the semiconductor substrate on the upper surface side. Also, the semiconductor device 100 of the present example includes an emitter electrode 52 and a gate electrode 50 provided above the upper surface of the semiconductor substrate. The emitter electrode 52 and the gate electrode 50 are provided isolated from each other. The gate trench part 40 and the dummy trench part 30 are examples of a trench part.

Although an interlayer insulating film is provided between the emitter electrode 52 and gate electrode 50 and the upper surface of the semiconductor substrate, it is omitted in FIG. 1. In the interlayer insulating film of the present example, contact holes 56, a contact hole 49 and contact holes 54 are provided to penetrate the interlayer insulating film.

The emitter electrode 52 is in contact with the emitter region 12, the contact region 15 and the base region 14 on the upper surface of the semiconductor substrate via the contact holes 54. Also, the emitter electrode 52 is connected to a dummy conductive portion inside the dummy trench part 30 via the contact hole 56. A connection portion 25 formed of a conductive material such as polysilicon doped with impurities may be provided between the emitter electrode 52 and the dummy conductive portion. The connection portion 25 is formed on the upper surface of the semiconductor substrate. An insulating film such as a thermal oxide film is provided between the connection portion 25 and the semiconductor substrate.

The gate electrode 50 is in contact with a gate runner 48 via the contact hole 49. The gate runner 48 is formed of polysilicon doped with impurities, for example. An insulating film such as a thermal oxide film is provided between the gate runner 48 and the semiconductor substrate. The gate runner 48 is connected to a gate conductive portion inside the gate trench part 40 on the upper surface of the semiconductor substrate. The gate runner 48 is not connected to the dummy conductive portion inside the dummy trench part 30. The gate runner 48 of the present example is formed from below the contact hole 49 to an edge portion 41 of the gate trench part 40. The edge portion 41 is an end portion of the gate trench part 40 closest to the gate electrode 50. In the edge portion 41 of the gate trench part 40, the gate conductive portion is exposed on the upper surface of the semiconductor substrate and is in contact with the gate runner 48.

The emitter electrode 52 and the gate electrode 50 are formed of a material including metal. For example, at least a part of a region of each electrode is formed of aluminum or an aluminum-silicon alloy. Each electrode may have a barrier metal formed of, for example, titanium or a titanium compound in a layer below the region formed of aluminum or the like. Also, a plug formed by embedding, for example, tungsten may be provided inside the contact hole to be in contact with the barrier metal and aluminum or the like.

One or more gate trench parts 40 and one or more dummy trench parts 30 are arrayed at predetermined intervals along a predetermined array direction in the region of the transistor section 70. The array direction in FIG. 1 is the X-axis direction. As used herein, the array direction may be referred to as a lateral direction. In the transistor section 70, one or more gate trench parts 40 and one or more dummy trench parts 30 may be alternately provided in the array direction.

The gate trench part 40 of the present example may have two extension portions 39 extending in an extension direction perpendicular to the array direction (portions of the trench that are linear along the extension direction) and an edge portion 41 connecting the two extension portions 39. The extension direction in FIG. 1 is the Y-axis direction. As used herein, the extension direction may also be referred to as a longitudinal direction. At least a part of the edge portion 41 is preferably formed in a curved shape. The end portions, which are each an end of a linear shape along the extension direction, of the two extension portions 39 of the gate trench part 40 are connected by the edge portion 41, so that electric field concentration at the end portions of the extensions portions 39 can be reduced.

The dummy trench part 30 of the present example is provided between adjacent two of the extension portions 39 of the gate trench parts 40. These dummy trench parts 30 may each have a linear shape extending in the extension direction.

In the transistor section 70, at its boundary with the diode section 80, an intermediate region 90 is provided, in which an emitter region is not provided on the surface. Also, a plurality of dummy trench parts 30 may be arrayed in succession in a part, which is in contact with the intermediate region 90, of the transistor section 70. The dummy trench part 30 provided in the part in contact with the intermediate region 90 may also have extension portions 29 and an edge portion 31. The edge portion 31 and the extension portions 29 have similar shapes to the edge portion 41 and the extension portions 39. The dummy trench part 30 having the edge portion 31 and the dummy trench part 30 having a linear shape may have the same length in the extension direction.

In the example of FIG. 1, the transistor section 70 at the boundary with the diode section 80 (i.e., the intermediate region 90, and the part in contact with the intermediate region 90) is provided with the dummy trench part 30 having the edge portion 31 and the extension portions 29. In the example of FIG. 1, the two extension portions 29 connected via the edge portion 31 are arrayed in succession in the array direction perpendicular to the extension direction of the extension portion 29. In contrast, on the inner side of the transistor section 70, the extension portions 39 of the gate trench parts 40 and the linear dummy trench parts 30 are alternately arrayed one by one.

The emitter electrode 52 is provided above the gate trench part 40, the dummy trench part 30, the well region 11, the emitter region 12, the base region 14 and the contact region 15. The well region 11 is provided within a predetermined range apart from an end portion of the contact hole 54 in the longitudinal direction. The end portion of the contact hole 54 is a portion, which is closest to the gate electrode 50, of the contact hole 54. A diffusion depth of the well region 11 may be greater than depths of the gate trench part 40 and the dummy trench part 30. Partial regions of the gate trench part 40 and the dummy trench part 30 that are closer to the gate electrode 50 are provided in the well region 11. A bottom of an end of the linear dummy trench part 30 in the extension direction and a bottom of the edge portion 31 of the dummy trench part 30 may be covered with the well region 11.

Mesa parts 61 and 60 sandwiched by the respective trench parts are provided with the base regions 14. The mesa part is a region on the upper surface side relative to the bottom or the deepest part of the trench part, in a part of the semiconductor substrate sandwiched between the two trench parts. The base region 14 is of a second conductivity-type having a doping concentration lower than that of the well region 11. The well region 11 is of a second conductivity-type. The base region 14 of the present example is of P– type, and the well region 11 is of P+ type.

On an upper surface of the base region 14 of the mesa part 61, the second conductivity-type contact region 15 having a doping concentration higher than that of the base region 14 is provided. The contact region 15 of the present example is of P+ type. The well region 11 may be provided apart from the contact region 15 in the active region, in a direction approaching the gate electrode 50. The contact region 15 is the contact region 15 arranged at the endmost position of the trench part in the extension direction. Also, in the transistor section 70, on a part of the upper surface of the contact region 15, the first conductivity-type emitter region 12 having a doping concentration higher than that of the semiconductor substrate is selectively provided. The emitter region 12 of the present example is of N+ type.

Each of the contact region 15 and the emitter region 12 is provided from one to the other of trench parts adjacent to each other. One or more contact regions 15 and one or more emitter regions 12 in the transistor section 70 are provided so as to be alternately exposed on the upper surface of the mesa part 61 along the extension direction of the trench part.

In another example, in the mesa part 61 of the transistor section 70, the contact region 15 and the emitter region 12 may be provided in a stripe shape along the extension direction. For example, the emitter region 12 is provided in a region in contact with the trench part, and the contact region 15 is provided in a region sandwiched between the emitter regions 12.

In the mesa part 61 of the diode section 80, the emitter region 12 may not be provided. Also, on an upper surface of the mesa part 61 in the intermediate region 90 (herein, referred to as intermediate mesa part 60), the contact region 15 may be provided. The contact region 15 of the intermediate mesa part 60 may be arranged to face at least one contact region 15 in the transistor section 70 in the X-axis direction. The dummy trench part 30 may be arranged between the contact region 15 of the intermediate mesa part 60 and the contact region 15 of the transistor section 70. On the upper surface of the intermediate mesa part 60, the contact region 15 arranged to face the emitter region 12 in the transistor section 70 in the X-axis direction may further be provided. In this case, the contact region 15 may be continuously provided between the base regions 14 exposed at both ends of the intermediate mesa part 60 in the trench extension direction.

In the transistor section 70, the contact hole 54 is provided above each of the contact region 15 and the emitter region 12. The contact hole 54 is not provided above the base region 14 and the well region 11.

In the diode section 80, the contact hole 54 is provided above each of the contact region 15 and the base region 14. The contact hole 54 of the present example is not provided for a base region 14-e, which is the closest to the gate electrode 50, of the plurality of base regions 14 of the mesa part 61 in the diode section 80. In the present example, the contact hole 54 in the transistor section 70 and the contact hole 54 in the diode section 80 have the same length in the extension direction of each trench part.

In the diode section 80, an N+ type cathode region 82 is provided in a region in contact with a lower surface of the semiconductor substrate. In FIG. 1, a region in which the cathode region 82 is provided is shown with a dotted line. In the region in contact with the lower surface of the semiconductor substrate, a P+ type collector region may be provided in a region in which the cathode region 82 is not provided. Herein, a region obtained by extending the region overlapping the cathode region 82 in the Z-axis direction to an end of the active region in the Y-axis direction is also referred to as the diode section 80. In FIG. 1, one mesa part 61 in the diode section 80 is shown. However, the diode section 80 may have a plurality of mesa parts 61 in the X-axis direction.

At least a part of a region of the transistor section 70 is provided with an N+type accumulation region 16. In FIG. 1, a region in which the accumulation region 16 is provided is shown with a dotted line. The accumulation region 16 may be provided below the emitter region 12 or the contact region 15 in each of the mesa parts 61.

Figure 2:
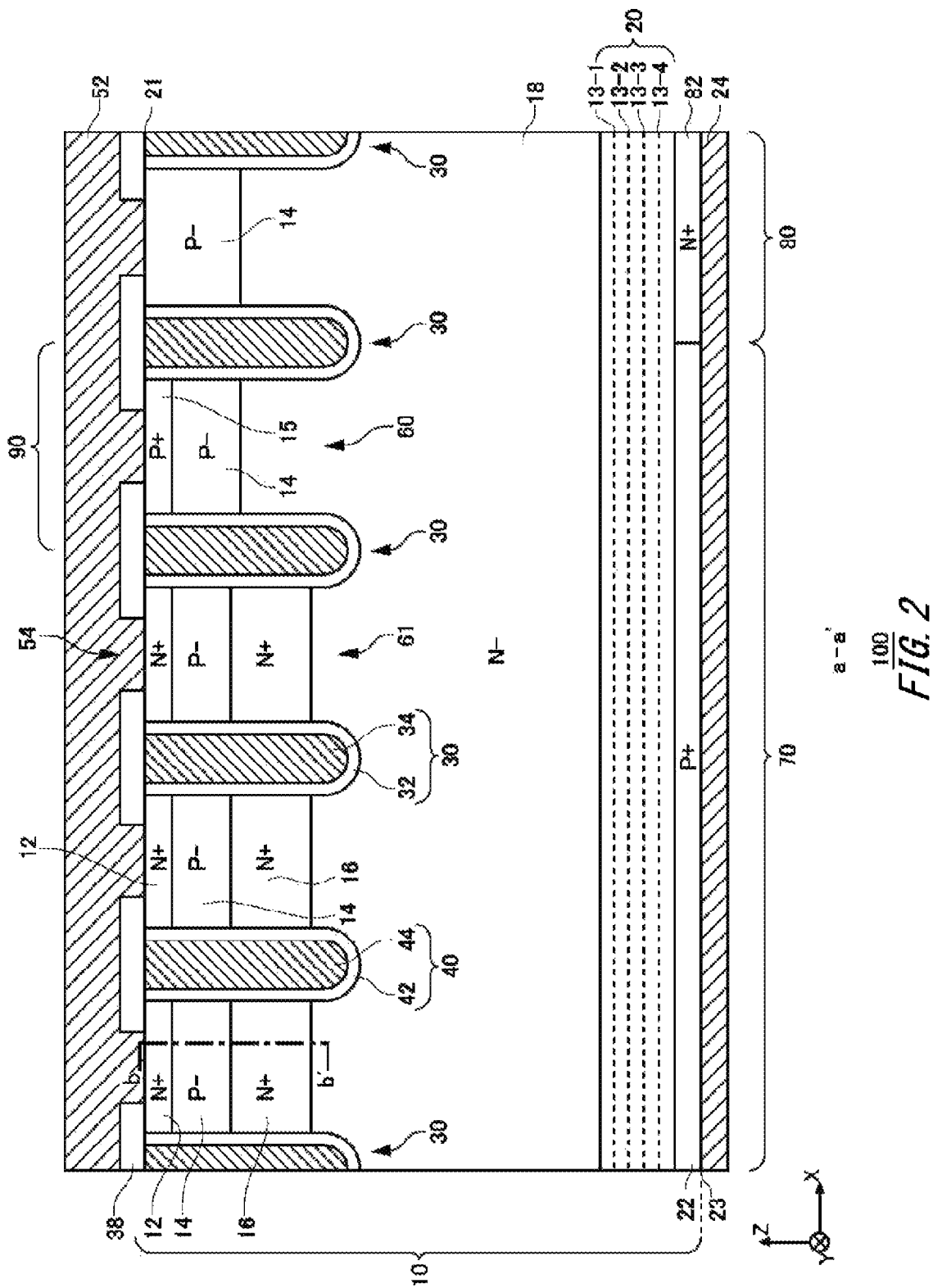
FIG. 2 shows an example of a cross-sectional view taken along a line a-a' in FIG. 1.

FIG. 2 shows an example of a cross-sectional view taken along the line a-a' in FIG. 1. The cross-section along a-a' is an XZ plane cross section cut through the emitter region 12. In the cross-section, the semiconductor device 100 of the present example includes a semiconductor substrate 10, an interlayer insulating film 38, an emitter electrode 52 and a collector electrode 24. The emitter electrode 52 is provided on upper surfaces of the semiconductor substrate 10 and the interlayer insulating film 38.

The collector electrode 24 is formed on the lower surface 23 of the semiconductor substrate 10. The emitter electrode 52 and the collector electrode 24 are respectively formed of a conductive material such as metal. Herein, a direction of a line connecting the emitter electrode 52 and the collector electrode 24 is referred to as a depth direction.

The semiconductor substrate 10 may be a silicon substrate, a silicon carbide substrate, a nitride semiconductor substrate such as gallium nitride, or the like. The semiconductor substrate 10 of the present example is a silicon substrate. In the cross-section, the P– type base region 14 is provided on an upper surface 21-side of the semiconductor substrate 10.

In the cross-section, the N+ type emitter region 12, the P– type base region 14 and the N+ type accumulation region 16 are provided on the upper surface 21-side of the semiconductor substrate 10 in the transistor section 70, in this order in a direction away from the upper surface 21 of the semiconductor substrate 10. However, the intermediate region 90 in the transistor section 70 may have other structures. In the present example, the P+ type contact region 15 and the P– type base region 14 are provided in the intermediate mesa part 60 of the intermediate region 90, in this order in the direction away from the upper surface 21 of the semiconductor substrate 10.

In the cross-section, the P– type base region 14 is provided on the upper surface 21-side of the semiconductor substrate 10 in the diode section 80. The diode section 80 of the present example is not provided with the accumulation region 16. In other examples, the diode section 80 may also be provided with the accumulation region 16.

In the transistor section 70, an N– type drift region 18 is provided below the accumulation region 16. The accumulation region 16 having a concentration higher than that of the drift region 18 is provided between the drift region 18 and the base region 14, so that it is possible to increase a carrier injection enhancement effect (IE effect), thereby reducing an on-voltage.

The accumulation region 16 of the present example is provided for each mesa part 61 in the transistor section 70. In the present example, the intermediate mesa part 60 in the intermediate region 90 is not provided with the accumulation region 16, and is provided with the drift region 18 in contact with the base region 14. The accumulation region 16 may be provided to entirely cover a lower surface of the base region 14 in each mesa part 61. In the diode section 80, the drift region 18 is provided on the lower surface of the base region 14. In both the transistor section 70 and the diode section 80, an N+ type buffer region 20 is provided below the drift region 18.

The buffer region 20 is provided below the drift region 18. A doping concentration of the buffer region 20 is higher than a doping concentration of the drift region 18. The buffer region 20 may serve as a field stop layer configured to prevent a depletion layer, which expands from the lower surface of the base region 14, from reaching the P+ type collector region 22 and the N+ type cathode region 82.

As an example, the buffer region 20 of the semiconductor device 100 has a plurality of peaks 13 in a doping concentration distribution in the depth direction. In FIG. 2, positions of the peaks 13 are shown with dotted lines. However, the doping concentration distribution in the buffer region 20 may have a single peak and may be a substantially uniform concentration all over the region. The semiconductor device 100 shown in FIG. 2 has four peaks in the buffer region 20. The uppermost peak 13-1 may be higher than the next uppermost peak 13-2 in terms of concentration.

In the transistor section 70, the P+ type collector region 22 is provided below the buffer region 20. In the diode section 80, the N+ type cathode region 82 is provided below the buffer region 20. In the active region, a projection region overlapping the cathode region 82 in the Z-axis direction is referred to as the diode section 80. That is, the region obtained by projecting the cathode region 82 onto the upper surface 21 of the semiconductor substrate 10 in a direction perpendicular to the lower surface 23 of the semiconductor substrate 10 is set as the diode section 80. As described above, a region obtained by extending the projection region to the end of the active region in the Y-axis direction may also be set as the diode section 80. Also, in the active region, a projection region obtained by projecting the collector region 22 onto the upper surface 21 of the semiconductor substrate 10 in a direction perpendicular to the lower surface 23 of the semiconductor substrate 10 and having regularly arranged therein predetermined structural units each including the emitter region 12 and the contact region 15 is set as the transistor section 70.

One or more gate trench parts 40 and one or more dummy trench parts 30 are provided on the upper surface 21-side of the semiconductor substrate 10. Each of the trench parts is provided to reach the drift region 18 from the upper surface 21 of the semiconductor substrate 10 while penetrating the base region 14. In a region in which at least one of the emitter region 12, the contact region 15 and the accumulation region 16 is provided, each of the trench parts is formed to reach the drift region 18 while penetrating the same. The configuration "the trench part penetrates the doping region" is not limited to those by the manufacturing sequence of forming the doping region and then forming the trench part. Those by the manufacturing of forming the trench parts and then forming the doping region between the trench parts is also included in the configuration "the trench part penetrates the doping region".

An end of the accumulation region 16 in the extension direction of the trench part (in the present example, the Y-axis direction) may overlap the contact regions 15 arranged at both ends in the Y-axis direction, as seen from a plan view of FIG. 1. The end of the accumulation region 16 in the Y-axis direction may be positioned below the contact region 15 in the depth direction of the semiconductor substrate 10. Also, the end of the accumulation region 16 in the Y-axis direction may be positioned between ends of the emitter region 12 and the contact hole 54 in the Y-axis direction. The emitter region 12 concerned is an emitter region 12, which is closest to the gate electrode 50, of the plurality of emitter regions 12 periodically provided in the Y-axis direction.

The gate trench part 40 has a gate trench, a gate insulating film 42 and a gate conductive portion 44, which are provided on the upper surface 21-side of the semiconductor substrate 10. The gate insulating film 42 is provided covering an inner wall of the gate trench. The gate insulating film 42 may be formed by oxidizing or nitriding a semiconductor of the inner wall of the gate trench. The gate conductive portion 44 is provided inside relative to the gate insulating film 42 in the gate trench. That is, the gate insulating film 42 insulates the gate conductive portion 44 and the semiconductor substrate 10 from each other. The gate conductive portion 44 is formed of a conductive material such as polysilicon.

The gate conductive portion 44 includes a region that faces the base region 14 with the gate insulating film 42 being interposed therebetween. In the cross-section, the gate trench part 40 is covered by the interlayer insulating film 38 on the upper surface 21 of the semiconductor substrate 10. When a predetermined voltage is applied to the gate conductive portion 44, a channel by an inversion layer of electrons is formed on a surface layer of the base region 14 at the interface in contact with the gate trench.

In the cross-section, the dummy trench part 30 may have the same structure as the gate trench part 40. The dummy trench part 30 has a dummy trench, a dummy insulating film 32 and a dummy conductive portion 34, which are provided on the upper surface 21-side of the semiconductor substrate 10. The dummy insulating film 32 is provided covering an inner wall of the dummy trench. The dummy conductive portion 34 is provided inside relative to the dummy insulating film 32 in the dummy trench. The dummy insulating film 32 insulates the dummy conductive portion 34 and the semiconductor substrate 10 from each other. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction. In the cross-section, the dummy trench part 30 is covered by the interlayer insulating film 38 on the upper surface 21 of the semiconductor substrate 10. In the meantime, bottoms of the dummy trench part 30 and the gate trench part 40 may each have a downwardly convex curved surface (a curved line in a cross-section).

Figure 3:
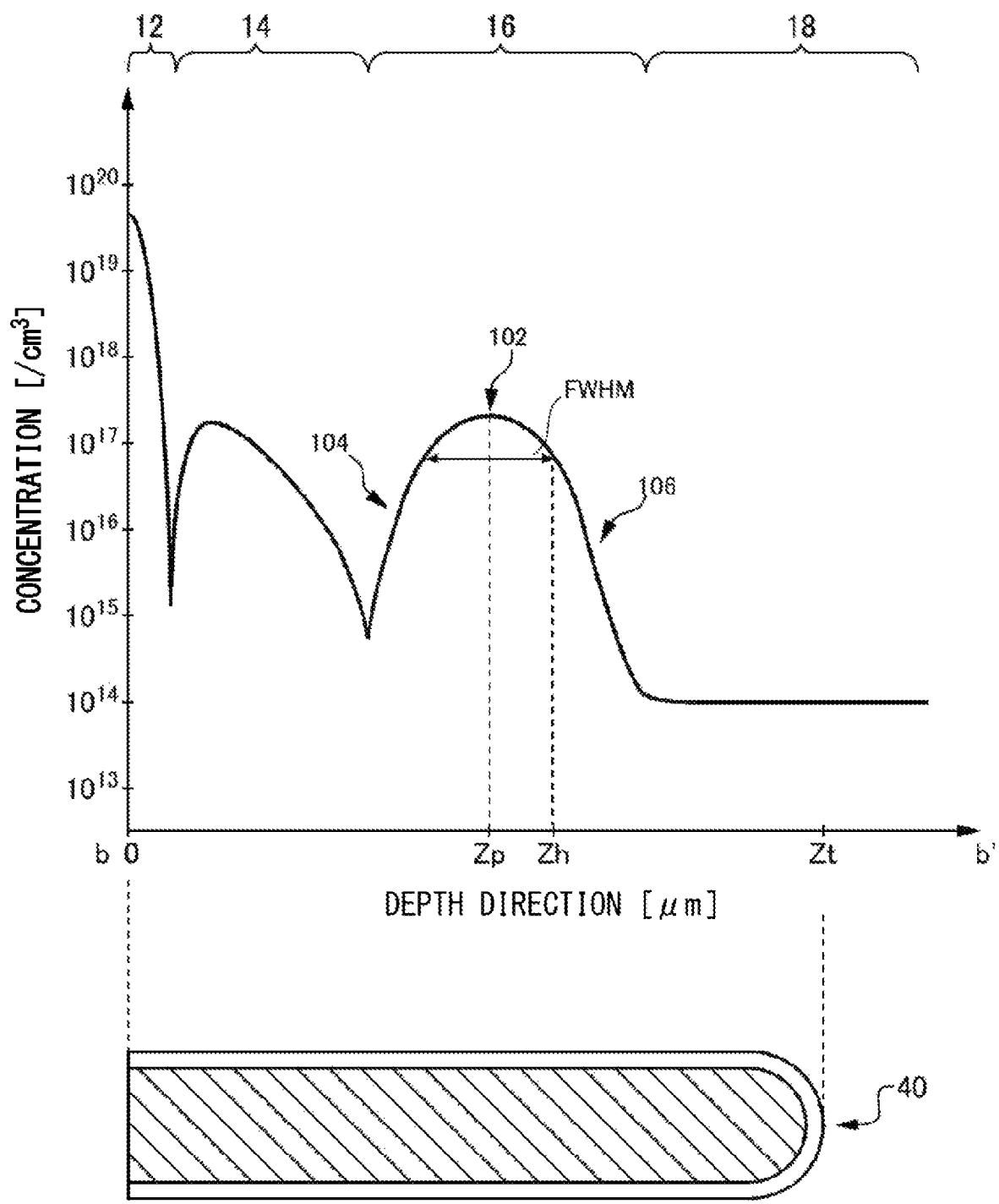
FIG. 3 shows an example of a doping concentration distribution in a cross-sectional view taken along a line b-b' in FIG. 2.

FIG. 3 shows an example of a doping concentration distribution in a cross-sectional view taken along a line b-b' in FIG. 2. The cross-section b-b' is an YZ plane passing the emitter region 12, the base region 14 and the accumulation region 16. That is, FIG. 3 shows a doping concentration distribution from the emitter region 12 to a top of the drift region 18 in the transistor section 70. As shown in FIG. 3, a vertical axis indicative of doping concentrations is herein a logarithmic axis. The doping concentration in FIG. 3 is a net doping concentration. Herein, the doping concentration distribution in the depth direction of the semiconductor substrate 10 is simply referred to as 'doping concentration distribution'.

The drift region 18 of the present example has a substantially constant doping concentration. The drift region 18 may be a region formed in a semiconductor substrate cut from an ingot formed by a CZ method, an MCZ method or an FZ method, or may be a region formed by epitaxial growth or the like. In the present example, the doping concentration distribution in the Z-axis direction of the emitter region 12, the base region 14 and the accumulation region 16 has a region in which the doping concentration reaches a maximum value, and also has a region in which the doping concentration decreases in contact with the region in which the doping concentration reaches a maximum value. The emitter region 12, the base region 14 and the accumulation region 16 may be formed by implanting impurities into the semiconductor substrate 10. In the present example, the base region 14 and the accumulation region 16 are provided in contact with each other. The description "the base region 14 and the accumulation region 16 are in contact with each other" indicates that a region having the same doping concentration as that of the drift region 18 is not provided between the base region 14 and the accumulation region 16.

In the accumulation region 16, a region in which the doping concentration reaches a maximum value is referred to as a maximum portion 102. The doping concentration distribution in the accumulation region 16 has an upper gradient portion 104 in which the doping concentration has a gradient to decrease in at least a part of a region from the maximum portion 102 to the base region 14 as moving toward the base region. In the present example, the entire region from the maximum portion 102 to the base region 14 is the upper gradient portion 104. That is, the doping concentration in the accumulation region 16 has a gradient to decrease in the entire region from the maximum portion 102 to the base region 14 as moving toward the base region. The doping concentration of the maximum portion 102 may be higher or lower than a peak concentration in the base region 14.

Also, the doping concentration distribution in the accumulation region 16 has a lower gradient portion 106 in which the doping concentration has a gradient to decrease in at least a part of a region from the maximum portion 102 to the drift region 18 as moving toward the drift region. In the present example, the entire region from the maximum portion 102 to the drift region 18 is the lower gradient portion 106. That is, the doping concentration in the accumulation region 16 has a gradient to decrease in the entire region from the maximum portion 102 to the drift region 18 as moving toward the drift region.

The description "the doping concentration has a gradient to decrease" indicates that, when a depth position is denoted as Z and the doping concentration is denoted as D, an absolute value of dD/dZ obtained by differentiating the doping concentration D with respect to the depth position Z has a finite value greater than zero (0). A magnitude of the gradient may be controlled by adjusting implantation conditions of impurities, heat treatment conditions after implantation, and the like.

A full width at half maximum FWHM of the doping concentration distribution in the accumulation region 16 is 2.2 times a predetermined standard full width at half maximum or greater. By increasing the full width at half maximum FWHM of the doping concentration distribution in the accumulation region 16, it is possible to reduce a turn-on loss while improving a tradeoff between an on-voltage and a turn-off loss.

The standard full width at half maximum is a full width at half maximum determined by setting a depth position Zp of the maximum portion 102 as a range of impurity implantation with reference to a range-full width at half maximum characteristic according to a material of the semiconductor substrate 10 and a type of impurities contained in the accumulation region 16. When impurities are implanted into the semiconductor substrate 10 within a predetermined range (i.e., the depth position of the semiconductor substrate 10), the impurities are distributed with predetermined unevenness in the depth direction. A magnitude of unevenness (straggling) in the depth position in which the impurities are implanted is determined according to a range of the impurities (i.e., the acceleration energy upon the implantation of the impurities). In the meantime, the magnitude of unevenness depends on a material of the semiconductor substrate 10 and a type of impurities to be implanted.

That is, the standard full width at half maximum corresponds to a full width at half maximum in a usual state in which impurities are implanted with the range being set to the depth position Zp and a heat treatment is not performed. The standard full width at half maximum may be a full width at half maximum when impurities are implanted perpendicularly to the upper surface of the semiconductor substrate. In contrast, in the semiconductor device 100, the full width at half maximum FWHM of the doping concentration distribution in the accumulation region 16 is set to be sufficiently greater than the standard full width at half maximum. Thereby, the tradeoff between the on-voltage and the turn-off loss is improved and the turn-on loss is reduced, which will be described later. In the meantime, when the doping concentration distribution in the accumulation region 16 exhibits the maximum value continuously in a predetermined depth range, a center of the depth range in which the maximum value is exhibited may be set as the depth position Zp of the maximum portion 102.

Figure 4:
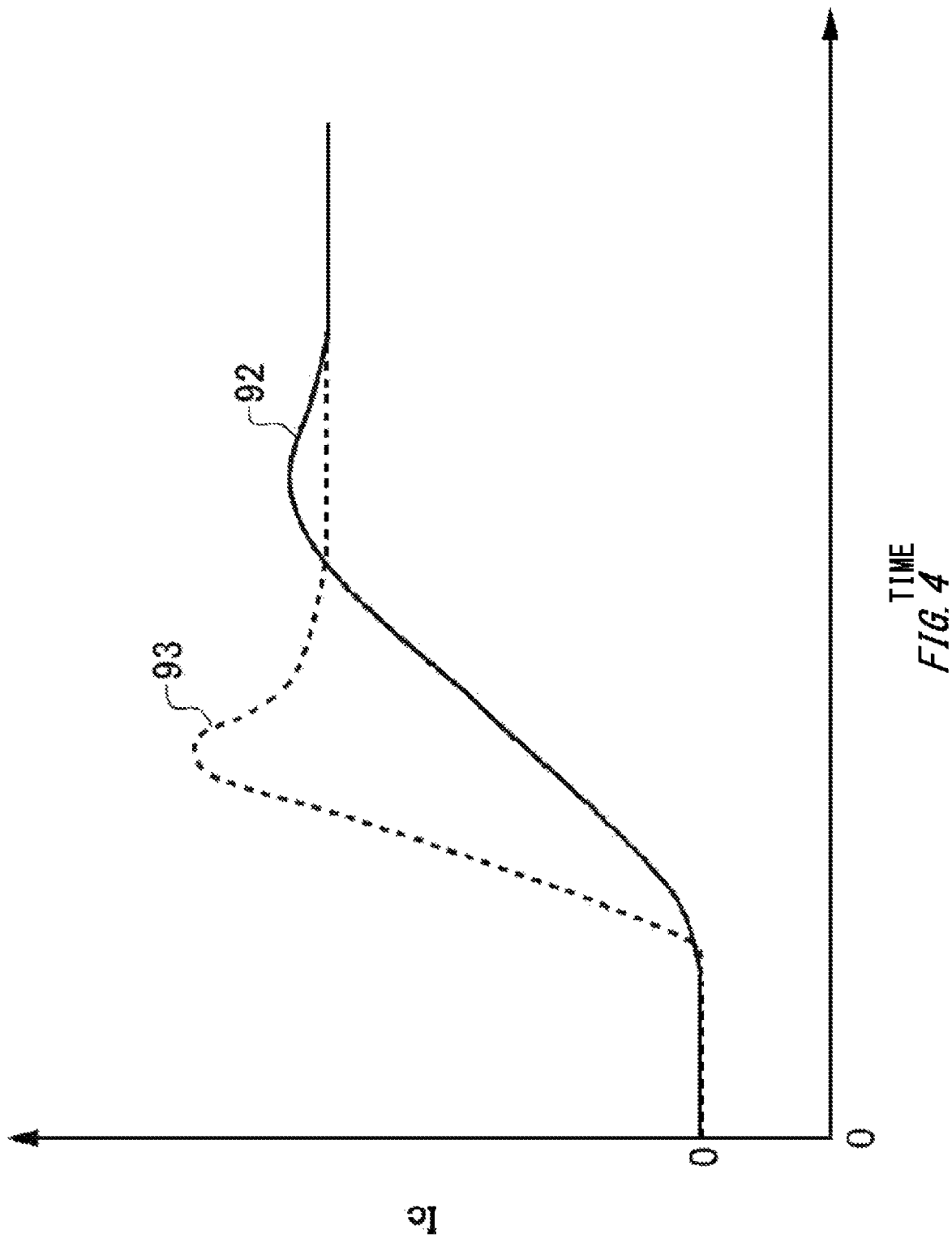
FIG. 4 shows an example of a waveform of collector current Ic upon turn-on of the semiconductor device 100.

FIG. 4 shows an example of a waveform of collector current Ic upon turn-on of the semiconductor device 100. A waveform 93 indicates the collector current Ic of Comparative Example in which the doping concentration distribution in the accumulation region 16 has the standard full width at half maximum. The accumulation region 16 is provided, so that a transient capacitance between a gate and a collector increases. For this reason, di/dt of the collector current Ic upon turn-on increases. In this case, the accumulation region 16 is provided, so that the tradeoff between the on-voltage and the turn-off loss is improved but di/dt upon turn-on increases. When the increase in di/dt is suppressed by increasing a gate resistance so as to adjust di/dt upon turn-on to a desired range, the turn-on loss increases.

A waveform 92 indicates the collector current Ic when the full width at half maximum of the doping concentration distribution in the accumulation region 16 is 2.2 times the standard full width at half maximum or greater. The accumulation region 16 having a large width is provided, so that the increase in transient capacitance between the gate and the collector can be suppressed. For this reason, it is possible to suppress the increase in di/dt of the collector current Ic upon turn-on. Therefore, it is possible to reduce the turn-on loss while improving the tradeoff between the on-voltage and the turn-off loss.

Figure 5:
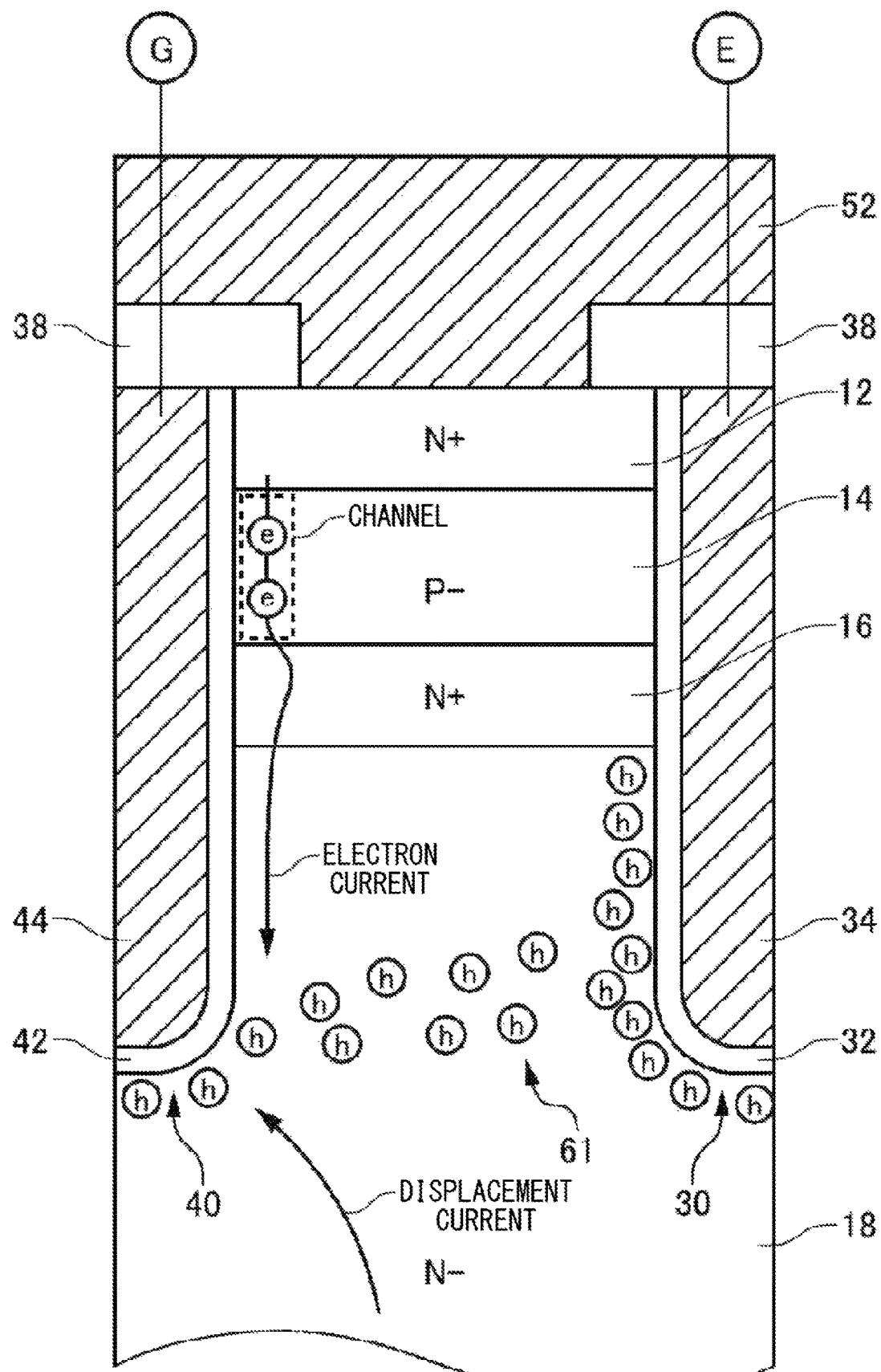
FIG. 5 shows an example of a path in which electron current and displacement current flow in the vicinity of a mesa part 61, in Comparative Example in which a doping concentration distribution in an accumulation region 16 has a standard full width at half maximum.

FIG. 5 shows an example of a path in which electron current and displacement current flow in the vicinity of the mesa part 61, in Comparative Example in which the doping concentration distribution in the accumulation region 16 has the standard full width at half maximum. FIG. 5 shows a current path upon turn-on. Upon turn-on, a voltage of the gate conductive portion 44 gradually increases from 0[V]. Thereby, a negative voltage is induced in the vicinity of the gate trench part 40 of the base region 14, so that a channel is formed.

A main current at the beginning of turn-on is electron current, not hole current. The beginning refers to a time period from immediately before a gate voltage Vge reaches a threshold voltage to before the gate voltage Vge enters a mirror period in which the gate voltage Vge is substantially constant at the threshold voltage. When the gate voltage Vge comes close to the threshold voltage, the channel starts to open and electron implantation into the drift region starts.

In Comparative Example of FIG. 5, the electrons flowing downward from the channel may flow once in the array direction (the X-axis direction, or, a direction directed from the vicinity of the gate trench part 40 toward a center of the mesa part 61) in the accumulation region 16. However, in the drift region 18 below the accumulation region 16, an accumulation layer of electrons has been already formed in the vicinity of the gate trench part 40 (a threshold voltage at which an accumulation layer of the electrons in an N type region is formed is further lower than a threshold voltage of an inversion layer in a P type region). Therefore, the impedance in the vicinity of the gate trench part 40 is lower than that of the drift region 18. For this reason, the electron current mainly flows in the vicinity of the gate trench part 40.

When the electrons reaches the collector region 22 of the backside, hole implantation is initiated from the collector region 22 to the buffer region 20 and the drift region 18. Thereby, holes are accumulated in the vicinity of a lower end of the trench part. As an example, the holes exist on the order of $1 \times 10^{16}$ [cm$^{-3}$] from the vicinity of the lower end of the gate trench part 40 to a side of the dummy trench part 30 below the accumulation region 16.

The holes gather at the lower end of the gate trench part 40 and at the lower end of the dummy trench part 30. In particular, since the dummy conductive portion 34 has the same potential as the emitter electrode 52, an inversion layer of holes are likely to be formed on a sidewall of the dummy trench part 30. The holes implanted from the collector region 22 gather in the vicinity of the inversion layer of holes. The holes are continuously distributed from the dummy trench part 30 to the lower end of the gate trench part 40. Due to the hole distribution, large displacement current flows in the vicinity of the lower end of the gate trench part 40 upon turn-on.

The displacement current attributed to the accumulation of holes charges the gate conductive portion 44 facing the holes with the gate insulating film 42 being interposed therebetween. The charging of the gate conductive portion 44 causes an instantaneous increase in gate voltage Vge. The higher the displacement current is, the potential of the gate conductive portion 44 increases more rapidly because the gate conductive portion 44 is charged. As a result, the potential of the gate conductive portion 44 instantaneously exceeds a gate threshold value.

Thereby, the electrons and the holes are implanted in a large amount, so that the current between the collector and the emitter increases. A voltage decrease rate (dV/dt) of the voltage between the collector and the emitter increases, in correspondence to a current change rate due to the increase in current between the collector and the emitter. The higher the displacement current is, the greater the voltage decrease rate (dV/dt) is. In particular, the less the accumulated holes flows to the emitter electrode 52, the displacement current becomes larger and the instantaneous increase in potential of the gate conductive portion 44 increases. Therefore, in Comparative Example of FIG. 5, the voltage decrease rate (dV/dt) is relatively large, and an electron noise is also relatively large.

Figure 6:
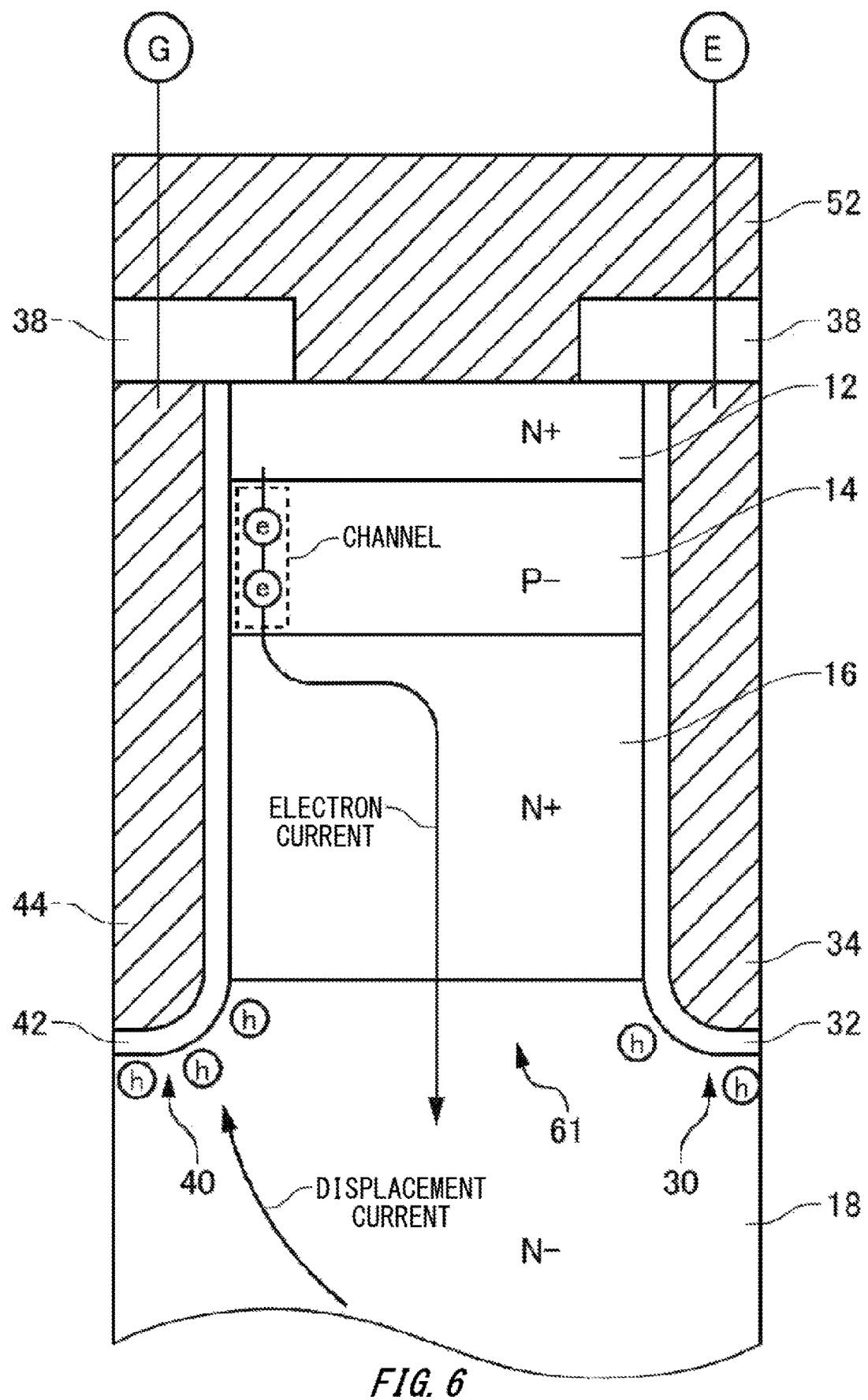
FIG. 6 shows the electron current and the displacement current upon turn-on, in the semiconductor device 100 in which a full width at half maximum of the doping concentration distribution in the accumulation region 16 is 2.2 times the standard full width at half maximum or greater.

FIG. 6 shows the electron current and the displacement current upon turn-on, in the semiconductor device 100 in which the full width at half maximum of the doping concentration distribution in the accumulation region 16 is 2.2 times the standard full width at half maximum or greater. Also in the present example, the electrons having passed through the channel intend to flow in the array direction (X-axis direction) in the accumulation region 16. However, in the present example, the accumulation region 16 is provided over a wide range in the depth direction.

In the present example, the impedance for the electron current is lower in a path in which the electron current flows directly in a direction immediately below the vicinity of the center of the accumulation region 16 than in a path in which the electron current returns from the vicinity of the center of the accumulation region 16 to the vicinity of the gate trench part 40. For this reason, the electron current can easily flow in the vicinity of the center of the mesa part 61.

As described above, at least a part of the electron current of the present example flows downward in the vicinity of the center of the mesa part 61 sandwiched between the gate trench part 40 and the dummy trench part 30, without returning to the vicinity of the gate trench part 40. That is, at least a part of the electron current of the present example flows in the vicinity of the center of the mesa part 61, not the vicinity of the gate trench part 40.

When the electron current flows in the vicinity of the center of the mesa part 61, the hole distribution in the vicinity of the bottom of the mesa part 61 is divided in the vicinity of the mesa part 61. For this reason, the holes closer to the dummy trench part 30-side than the path of the electron current do not flow toward the gate trench part 40. The division of the hole distribution at the central portion of the mesa part 61 suppresses the accumulation of holes at the lower end of the gate trench part 40. As a result, it is possible to reduce the displacement current in the example of FIG. 6, as compared to the example of FIG. 5. Since it is possible to reduce the displacement current, the charging of the gate conductive portion 44 is also reduced and the instantaneous increase in gate voltage Vge is also suppressed. Thereby, the voltage decrease rate (dV/dt) of the voltage between the collector and the emitter can also be suppressed.

The inventors confirmed through simulation that the holes are mainly distributed at the lower end of the gate trench part 40 and the lower end and side of the dummy trench part 30 and are little distributed at the central portion of the mesa part 61. As an example, the holes exist on the order of $1 \times 10^{13}$ [cm$^{-3}$] in the vicinity of the lower end of the gate trench part 40 and the lower end of the dummy trench part 30, which is significantly lower than $1 \times 10^{16}$ [cm$^{-3}$] in Comparative Example of FIG. 5.

Although not limited to following reasons, it is considered that the hole distribution in the example of FIG. 6 is caused due to the division of the hole distribution between the gate trench part 40 and the dummy trench part 30 by the electron current. Also, due to the hole distribution, the displacement current smaller than that of Comparative Example in FIG. 5 flows from the vicinity of the lower end of the dummy trench part 30 toward the vicinity of the lower end of the gate trench part 40 upon turn-on.

Therefore, since the displacement current of the present example is smaller than that of Comparative Example in FIG. 5, the voltage decrease rate (dV/dt) is smaller, as compared to Comparative Example in FIG. 5, and the electron noise can also be reduced. Also, in the present example, it is not necessary to connect, to the gate conductive portion 44, an additional gate resistor Rg for suppressing rapid increase in potential of the gate conductive portion 44. Alternatively, when a small gate resistor Rg is connected to the gate conductive portion 44, it is possible to suppress rapid increase in potential of the gate conductive portion 44. Therefore, it is possible to reduce the power loss upon turn-on, as compared to Comparative Example in FIG. 5.

In the meantime, the full width at half maximum FWHM of the doping concentration distribution in the accumulation region 16 may be equal to or greater than three times, four times or five times the standard full width at half maximum. When the width of the accumulation region 16 is increased, the above-described effects become more remarkable. However, the accumulation region 16 is preferably provided in a region shallower than the lower end of the gate trench part 40. In the depth direction of the semiconductor substrate 10, a sum of a distance (distance from a depth position 0 to a depth position Zp in FIG. 3) from the upper surface 21 of the semiconductor substrate 10 to the maximum portion 102 of the accumulation region 16 and the half width at half maximum (distance between the depth positions Zh and Zp in FIG. 3) of the doping concentration distribution in the accumulation region 16 may be equal to or smaller than a distance (distance from the depth position 0 to a depth position Zt in FIG. 3) from the upper surface 21 of the semiconductor substrate 10 to the lower end of the gate trench part 40. Also, the full width at half maximum FWHM of the doping concentration distribution in the accumulation region 16 may be equal to or smaller than 30 times, 20 time, 10 times, 8 times or 6 times the standard full width at half maximum.

Figure 7:
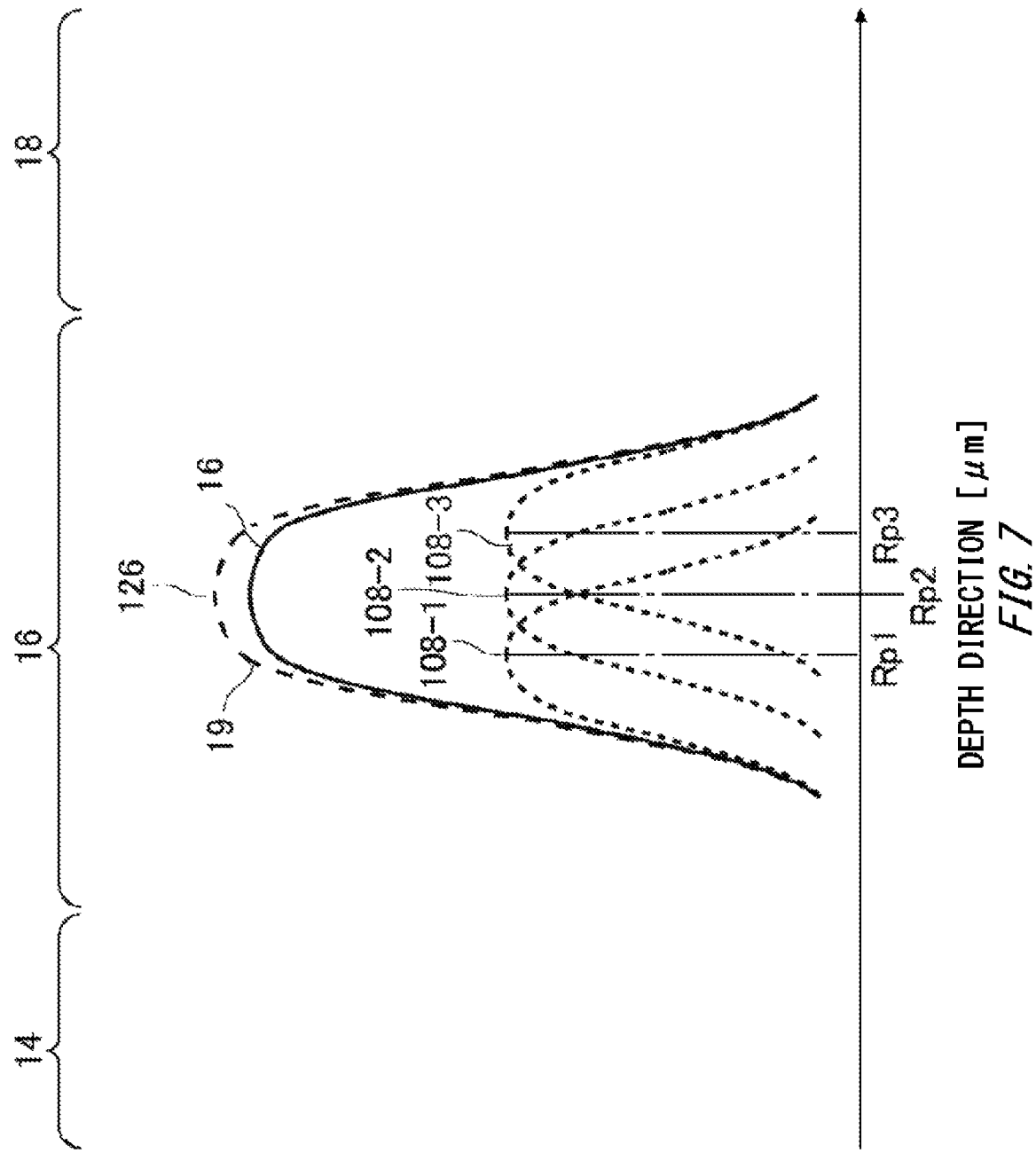
FIG. 7 illustrates an example of a process of forming the accumulation region 16.

FIG. 7 illustrates an example of a process of forming the accumulation region 16. In FIG. 7, the doping concentration distribution in a partial region of the accumulation region 16 is shown with the solid line. The accumulation region 16 having a large full width at half maximum can be formed by implanting impurities into the semiconductor substrate 10 within a plurality of different ranges. In the example of FIG. 7, the impurities are implanted within three ranges Rp1, Rp2 and Rp3. The distributions 108 of impurities corresponding to the respective ranges are shown with the dotted lines. After implanting the impurities, the heat treatment such as annealing is performed at a predetermined temperature for predetermined time, so that the accumulation region 16 having the doping concentration distribution shown with the solid line can be formed. In the meantime, the method of forming the accumulation region 16 is not limited to the method shown in FIG. 7. In the process of forming the accumulation region 16, the impurities may be implanted obliquely or perpendicularly relative to the upper surface 21 of the semiconductor substrate 10.

Also, a position 126 in which a chemical concentration distribution 19 of impurities (dopants) forming the accumulation region 16 exhibits a maximum value may be located in the accumulation region 16. In the example of FIG. 7, the position 126 of the chemical concentration distribution 19 of phosphorus, which is impurities (dopants), is located within both ends (a boundary with the base region 14 and a boundary with the drift region 18) of the doping concentration distribution in the accumulation region 16 in the depth direction. The position 126 may be located within a range in which the doping concentration of the accumulation region 16 is 1/10 of the maximum value of the doping concentration distribution or greater.

Also, the accumulation region 16 is formed by implanting the impurities within the plurality of ranges Rp, so that it is possible to keep an integral concentration of impurities in the entire accumulation region 16 while suppressing a dose amount in each of the ranges Rp. For this reason, it is possible to suppress a dose amount in the range close to the base region 14. Therefore, it is possible to suppress a large amount of N-type impurities from diffusing into the base region 14, and to suppress the base region 14 from being shortened in the depth direction.

Figure 8:
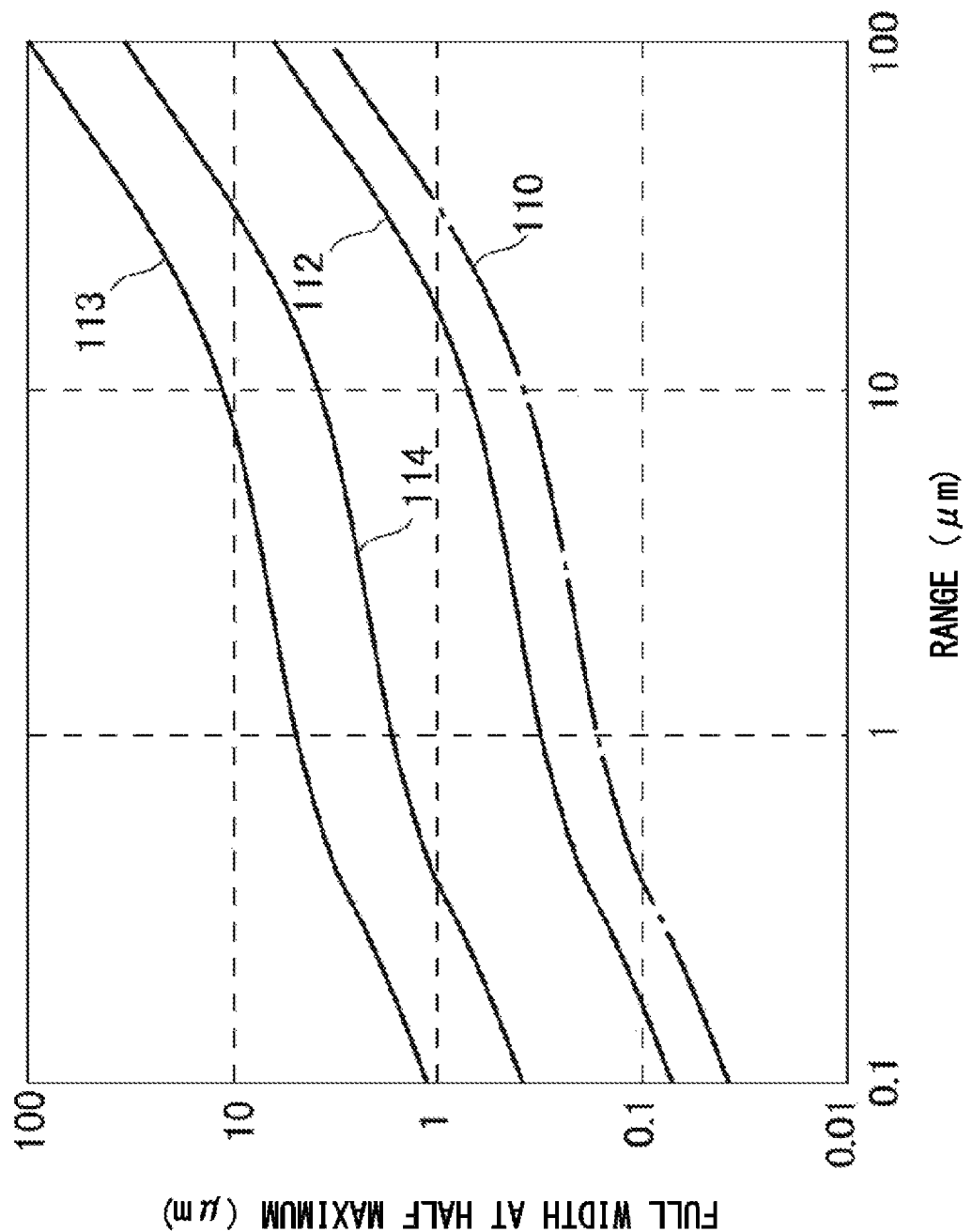
FIG. 8 shows an example of a range-full width at half maximum characteristic.

FIG. 8 shows an example of a range-full width at half maximum characteristic. In FIG. 8, the semiconductor substrate 10 is a silicon substrate, and the impurities that are implanted so as to form the accumulation region 16 are phosphorus. The standard full width at half maximum in each range is obtained by measuring a distribution of impurities in a state in which the impurities are implanted into the semiconductor substrate within the range and the heat treatment is not performed. As an example, when phosphorus is implanted to the silicon substrate, the range-full width at half maximum characteristic can be approximated by a following equation:

$$y=0.01763x^6-0.11077x^5+0.15065x^4+0.21668x^3-0.30410x^2+0.39392x-0.77003 \quad \text{[equation 1]}$$

where x is a common logarithm ($\log_{10}$ (Rp)) of the range Rp (μm), and y is a common logarithm ($\log_{10}$ (FWHM)) of the full width at half maximum FWHM (μm). For other substrate materials and impurities, the range-full width at half maximum characteristic can be actually measured, as described above. Also, the standard full width at half maximum in any range may be calculated by approximating a standard full width at half maximum in the accumulation region 16 formed with a larger range than the corresponding range and a standard full width at half maximum in the accumulation region 16 formed with a smaller range than the corresponding range with a straight line.

In FIG. 8, a curve 110 corresponding to equation 1 is shown. A curve 112 is a curve obtained by multiplying the full width at half maximum of the curve 110 by 2.2 times. The doping concentration distribution in the accumulation region 16 has a full width at half maximum equal to or greater than a full width at half maximum that is determined when the depth position Zp of the maximum portion 102 is used as the range of the curve 112. A curve 114 is a curve obtained by multiplying the full width at half maximum of the curve 110 by 10 times. A curve 113 is a curve obtained by multiplying the full width at half maximum of the curve 110 by 30 times. The doping concentration distribution in the accumulation region 16 may have a full width at half maximum equal to or smaller than a full width at half maximum that is determined when the depth position Zp of the maximum portion 102 is used as the range of the curve 114. As described above, the full width at half maximum FWHM of the doping concentration distribution in the accumulation region 16 may be 2.2 times the standard full width at half maximum or greater. Also, the full width at half maximum FWHM of the doping concentration distribution in the accumulation region 16 may be equal to or smaller than 30 times, 20 times, 10 times, 8 times or 6 times the standard full width at half maximum.

Figure 9:
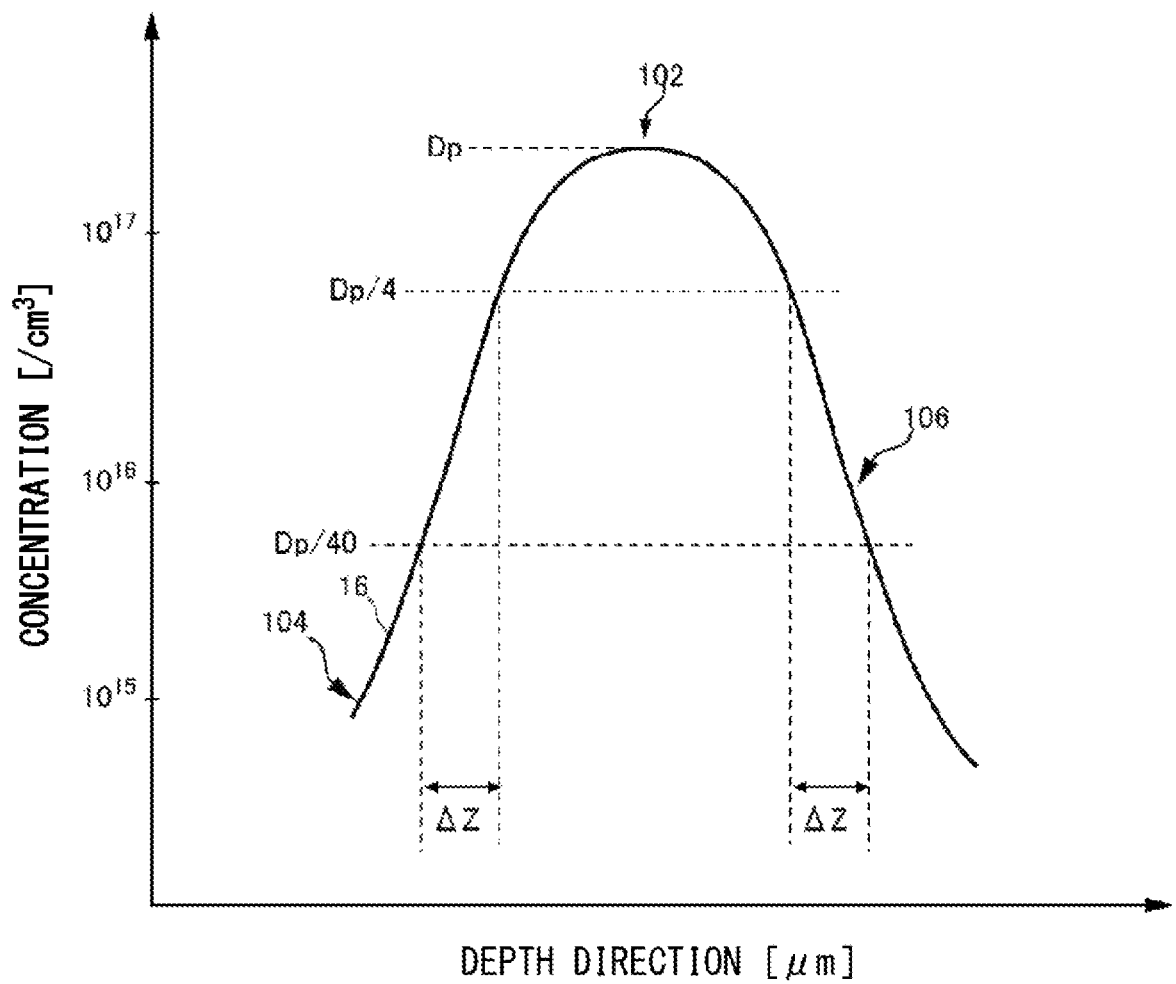
FIG. 9 shows partially an example of the doping concentration distribution in the accumulation region 16.

FIG. 9 shows partially an example of the doping concentration distribution in the accumulation region 16. A distance ΔZ from a depth position, at which a ratio of a doping concentration to a doping concentration Dp of the maximum portion 102 is 1/4 (Dp/4), to a depth position, at which the ratio is 1/40 (Dp/40), in the doping concentration distribution in the accumulation region, is preferably between 0.1 μm and 1.0 μm inclusive. The upper gradient portion 104 may meet the condition of the distance ΔZ, or both the upper gradient portion 104 and the lower gradient portion 106 may meet the condition of the distance ΔZ.

When the distance ΔZ is smaller than 0.1 μm, a gradient of the doping concentration distribution in the accumulation region 16 is too steep and an electric field may be concentrated on the gradient portion of the accumulation region 16. In contrast, when the distance ΔZ is set to 0.1 μm or greater, the electric field concentration on the gradient portion can be reduced. The distance ΔZ may be 0.2 μm or greater, or 0.3 μm or greater.

When the distance ΔZ is greater than 1.0 μm, the N-type impurities diffuse into the base region 14-side, so that a length of the base region 14 in the depth direction (i.e., a length of the channel) is shortened. When the length of the channel is shortened, variation in saturation current increases. In contrast, when the distance ΔZ is set smaller than 1.0 μm, it is possible to easily keep the length of the channel. The distance ΔZ may be 0.9 μm or smaller, or 0.8 μm or smaller.

Figure 10:
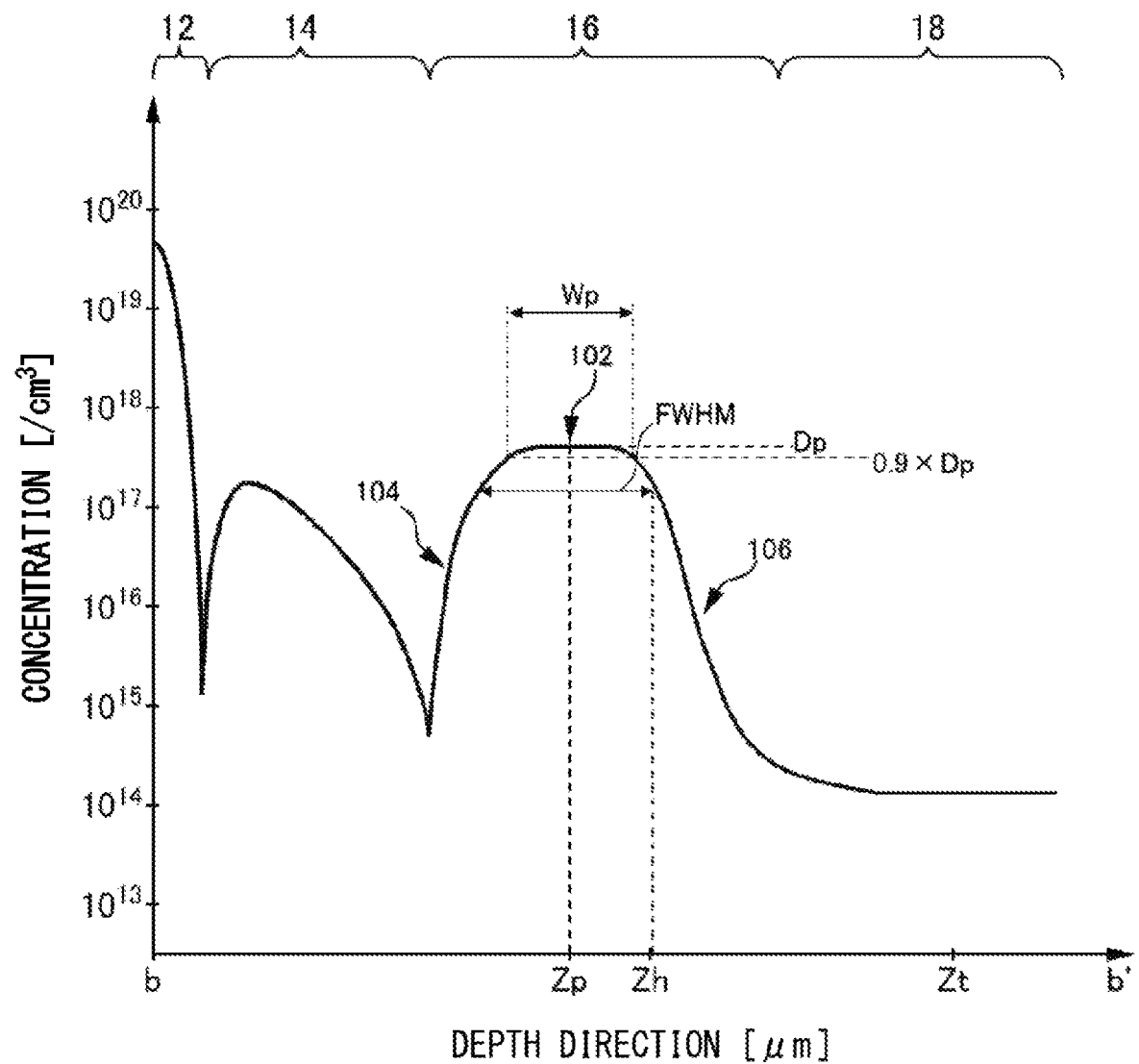
FIG. 10 shows another example of the doping concentration distribution in the accumulation region 16.

FIG. 10 shows another example of the doping concentration distribution in the accumulation region 16. The doping concentration distribution of the present example has a substantially flat maximum portion 102. That is, the doping concentration distribution has substantially the same doping concentration as the maximum doping concentration Dp in the accumulation region 16 over a predetermined depth range Wp. The doping concentration, which is substantially the same as the doping concentration Dp, is a doping concentration of 0.9×Dp or greater, for example. The doping concentration, which is substantially the same as the doping concentration Dp, may be a doping concentration of 0.95× Dp or greater, for example. A length of the range Wp may be 0.3 μm or greater, 0.5 μm or greater or 1 μm or greater. The doping concentration distribution in the accumulation region 16 further has an upper gradient portion 104 in which the doping concentration has a gradient to decrease in at least a part of a region toward the base region 14, and a lower gradient portion 106 in which the doping concentration has a gradient to decrease in at least a part of a region toward the drift region 18. In this case, a center of a predetermined depth range in which the maximum portion 102 is located may be used as the depth position Zp of the maximum portion 102. The maximum portion 102 is provided over the predetermined depth range, so that the full width at half maximum FWHM can be easily increased.

Figure 11:
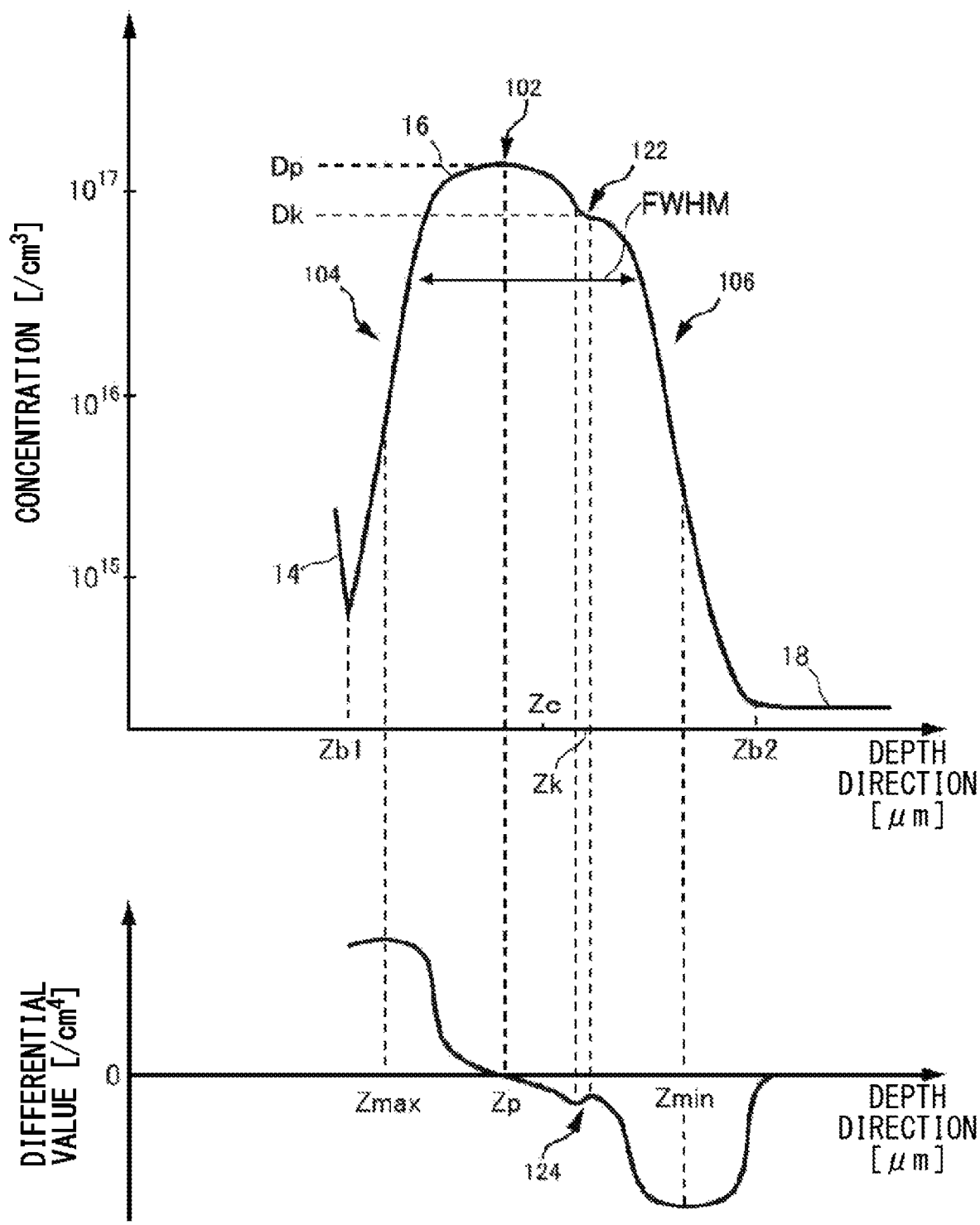
FIG. 11 shows another example of the doping concentration distribution in the accumulation region 16.

FIG. 11 shows another example of the doping concentration distribution in the accumulation region 16. The doping concentration distribution of the present example has a kink portion 122 at which a differential value of the doping concentration distribution exhibits an extreme value 124 in a region except a region in which the differential value exhibits a maximum value or a minimum value. The differential value of the doping concentration distribution refers to a value obtained by differentiating the doping concentration distribution with respect to the depth position Z. In the present example, the differential value becomes a maximum value at a predetermined depth position Zmax in the upper gradient portion 104, and the differential value becomes a minimum value at a predetermined depth position Zmin in the lower gradient portion 106. The differential value has an extreme value at a predetermined position Zk between the depth positions Zmax and Zmin.

The kink portion 122 is provided, so that a slope of the gradient portion of the doping concentration distribution is partially reduced. Therefore, it is possible to easily increase the full width at half maximum FWHM. The kink portion 122 may be provided at one or both of the upper gradient portion 104 and the lower gradient portion 106. As an example, the kink portion 122 may be formed by setting the distance between the respective ranges Rp shown in FIG. 7 to a predetermined distance or greater.

One of the maximum portion 102 and the kink portion 122 may be arranged in a region above a central position Zc of the accumulation region 16 in the depth direction, and the other of the maximum portion 102 and the kink portion 122 may be arranged in a region below the center of the accumulation region 16 in the depth direction. In the present example, a center between a boundary position Zb1 between the accumulation region 16 and the base region 14 and a boundary position Zb2 between the accumulation region 16 and the drift region 18 is set as the central position Zc of the accumulation region 16. In the present example, the maximum portion 102 is arranged in an upper region from the central position Zc to the boundary position Zb1, and the kink portion 122 is arranged in a lower region from the central position Zc to the boundary position Zb2. Even with the above structure, it is possible to easily increase the full width at half maximum FWHM.

Also, a doping concentration Dk at the kink portion 122 may be 1/10 of the doping concentration Dp at the maximum portion 102 or greater. The doping concentration Dk of the kink portion 122 is set to a concentration relatively close to the doping concentration Dp of the maximum portion 102, so that it is possible to expand a region in which the doping concentration is high. The doping concentration Dk may be 1/5 or 1/2 of the doping concentration Dp or greater.

Figure 12:
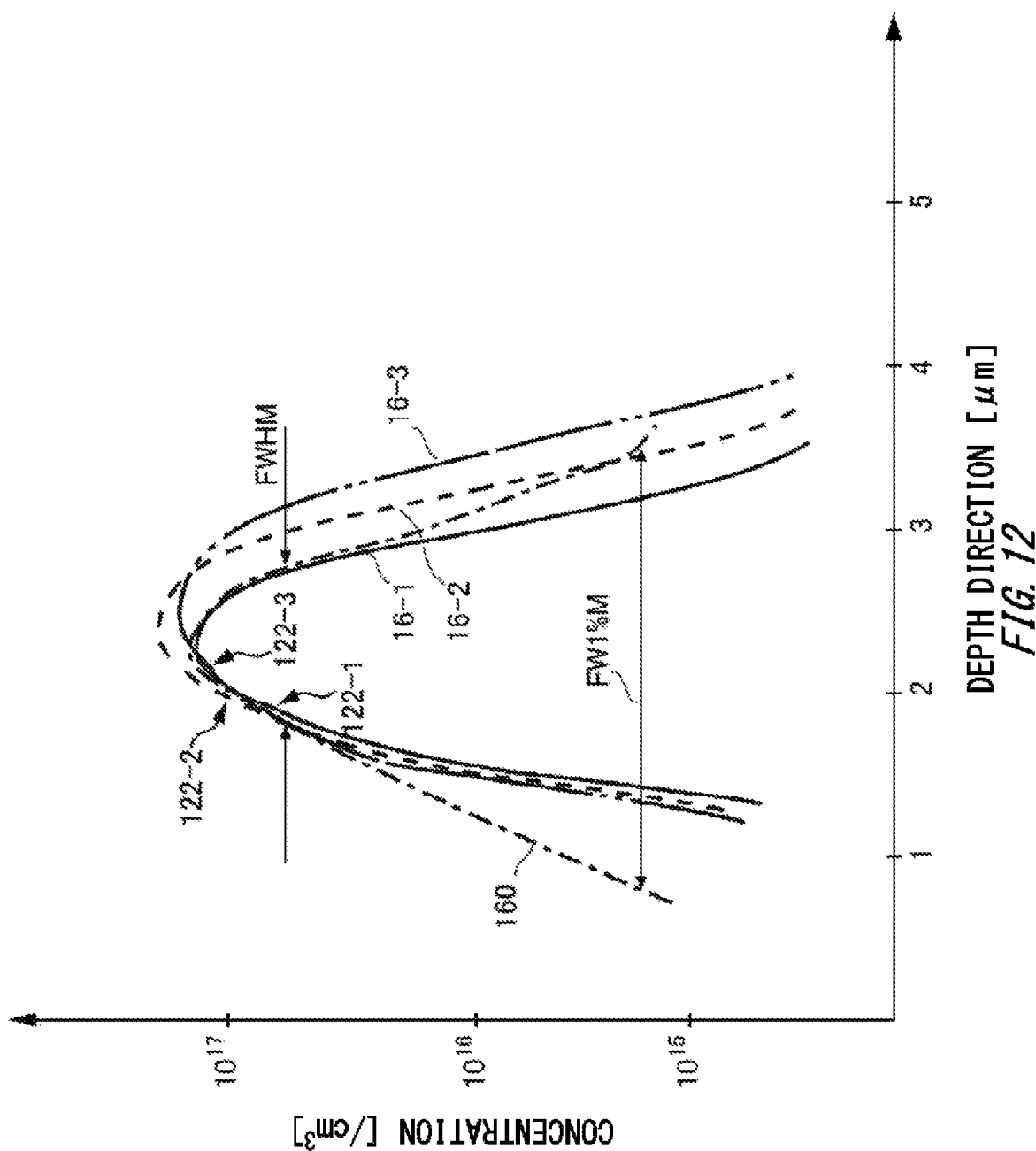
FIG. 12 shows an example of the doping concentration distribution in the accumulation region 16 when an implantation condition of impurities into the accumulation region 16 has been changed.

FIG. 12 shows an example of the doping concentration distribution in the accumulation region 16 when an implantation condition of impurities into the accumulation region 16 has been changed. The semiconductor substrate 10 of the present example is a silicon substrate, and the impurities are phosphorus. A chemical concentration distribution in the accumulation region 16-1 is an example in which the impurities are implanted twice with the acceleration energy of 2.6 MeV and 3.0 MeV. A chemical concentration distribution in the accumulation region 16-2 is an example in which the impurities are implanted three times with the acceleration energy of 2.6 MeV, 3.0 MeV and 3.4 MeV. A chemical concentration distribution in the accumulation region 16-3 is an example in which the impurities are implanted three times with the acceleration energy of 2.6 MeV, 3.4 MeV and 3.9 MeV. In the meantime, for one implantation, the impurities were implanted in a doping amount of $6\times10^{12}/cm^2$. In each example, after implanting all the impurities, the heat treatment was performed at 1000° C. for 30 minutes. In the meantime, the kink portions 122-1, 122-2 and 122-3 of the chemical concentration distributions in the accumulation regions 16-1, 16-2 and 16-3 are denoted with arrows.

As shown in FIG. 12, it is possible to adjust the full width at half maximum of the chemical concentration distribution in the accumulation region 16 by changing the implantation condition of the impurities. In the example of the accumulation region 16-1, the depth position of the maximum portion 102 is 2.1 μm, and the full width at half maximum is 3.2 times the standard full width at half maximum. In the example of the accumulation region 16-2, the depth position of the maximum portion 102 is 2.3 μm, and the full width at half maximum is 3.9 times the standard full width at half maximum. In the example of the accumulation region 16-3, the depth position of the maximum portion 102 is 2.5 μm, and the full width at half maximum is 4.8 times the standard full width at half maximum.

In the meantime, while performing a plurality of times of the ion implantations, the implantation in which the high acceleration energy is high is preferably performed before the implantation in which the acceleration energy is low. Alternatively, the implantation in which the acceleration energy is low may be first performed. Also, the position and concentration of the kink portion may be adjusted by adjusting a sequence of the ion implantations of different acceleration energies.

A distribution 160 in FIG. 12 indicates a chemical concentration distribution of dopants in the accumulation region 16 in accordance with another example. An entire width of the distribution 160 at 1/100 of the peak concentration is increased to 1.3 times or greater, as compared to the case of the semiconductor device 100. As an example, the distribution 160 refers to an example in which the accumulation region 16 is formed by one ion implantation and heat treatment at 1100° C. for 30 minutes. However, the manufacturing method is not limited thereto. In the meantime, the full width at half maximum of the distribution 160 is set equivalent to that of the accumulation region 16-1.

When a full width at 1/100 of the peak concentration of the chemical concentration distribution refers to a full width at 1% of maximum (FW1% M), a ratio (FWHM/FW1% M) of the full width at half maximum to a full width at 1% of maximum of the distribution 160 is 0.26. Also, a width on the upper surface 21-side of the semiconductor substrate 10 is wider than a width on the lower surface 23-side at the full width at 1% of maximum (FW1% M), with respect to the depth position Zp (not shown) of the maximum portion 102. For this reason, the width of the base region 14 is narrowed, and the withstand voltage lowering and the threshold value are easily affected.

In the meantime, in the cases of the accumulation regions 16-1, 16-2 and 16-3 of the present example, the full width at 1% of maximum to the full width at half maximum FWHM is not relatively expanded. For example, in the accumulation region 16-2, a ratio of the full width at half maximum to the full width at 1% of maximum is 0.35. Also, in the chemical concentration distributions of the accumulation regions 16-1 to 16-3, a width on the upper surface 21-side of the semiconductor substrate 10 and a width on the lower surface 23-side at the full width at 1% of maximum are substantially the same or the width on the lower surface 23-side is greater, with respect to the depth position Zp of the maximum portion 102. Thereby, the influence on the width of the base region 14 is negligible, and it is difficult to exert an influence on the withstand voltage lowering and the threshold value fluctuation.

In the present example, the ratio (FWHM/FW1% M) of the accumulation region 16 is preferably greater than 0.26, 0.27 or greater, 0.3 or greater, or 0.4 or greater. Also, the ratio (FWHM/FW1% M) is smaller than 1. Also, the ratio (FWHM/FW1% M) may be 0.9 or smaller, or 0.8 or smaller.

Figure 13:
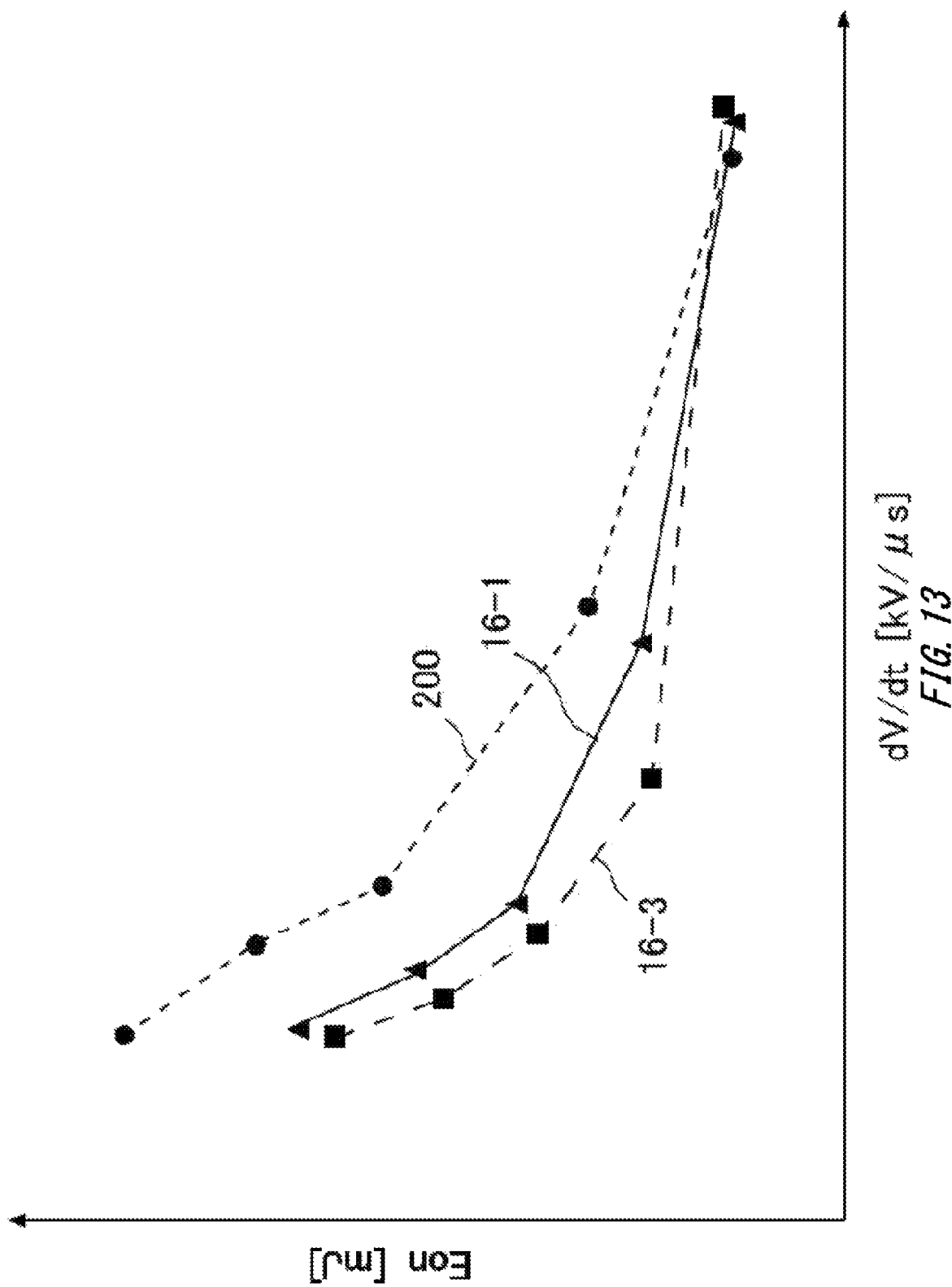
FIG. 13 shows a relationship between dV/dt and on-loss Eon upon reverse recovery.

FIG. 13 shows a relationship between dV/dt and on-loss Eon upon reverse recovery. FIG. 13 shows examples of the accumulation region 16-1 or 16-3, and Comparative Example 200 in which the full width at half maximum of the doping concentration distribution is 2.1 times the standard full width at half maximum. The full width at half maximum of the doping concentration distribution in the accumulation region 16 is increased, so that the tradeoff between dV/dt and the on-loss Eon is improved.

The significance of setting the full width at half maximum FWHM of the doping concentration distribution in the accumulation region 16 having the maximum portion 102, the upper gradient portion 104 and the lower gradient portion 106 to be 2.2 times the standard full width at half maximum or greater is as follows. When the semiconductor device corresponding to the curve 110 (refer to FIG. 8) of the standard full width at half maximum is subjected to thermal annealing, the peak concentration of the doping concentration distribution is reduced, so that the full width at half maximum is expanded. For example, with respect to the standard full width at half maximum determined by only one ion implantation, according to the verification result by various thermal annealing, the most favorable condition in the relation between dV/dt and the on-loss Eon upon the reverse recovery was Comparative Example 200 having the accumulation region in which the full width at half maximum of the doping concentration distribution is 2.1 times the standard full width at half maximum. That is, in the accumulation region 16 obtained by one ion implantation and thermal annealing, it is difficult to obtain more favorable electrical characteristics than Comparative Example 200.

For example, in order to expand the full width at half maximum of the accumulation region by increasing the dose amount of dopants in the process of one ion implantation or increasing the temperature or time in the process of thermal annealing, a thermal budget is increased, so that it is necessary to perform the treatment at the initial process stage. For this reason, it is difficult to configure each layer and to make a cell pitch and the like finer. Also, in order to expand the full width at half maximum by one ion implantation, it is necessary to increase the acceleration energy. However, the damage (disorder) on the trench part and the base region increases, and the threshold value control is also relatively difficult.

In contrast, in the semiconductor device 100 including the maximum portion 102, the upper gradient portion 104 and the lower gradient portion 106 and having the accumulation region 16 in which the full width at half maximum is 2.2 times the standard full width at half maximum or greater, the relationship between dV/dt and the on-loss Eon upon the reverse recovery is dramatically improved. That is, the semiconductor device 100 having the accumulation region 16 in which the full width at half maximum is 2.2 times the standard full width at half maximum or greater is a semiconductor device by which it is possible to realize more remarkable effects, as compared to the other semiconductor devices such as Comparative Example 200. That is, in the semiconductor device 100 having the accumulation region 16 in which the full width at half maximum is 2.2 times the standard full width at half maximum or greater, a boundary value of 2.2 times is a value meaning a boundary having an important and critical significance. In the meantime, the accumulation region 16 is preferably formed by the plurality of times of ion implantations but may be formed by one ion implantation.

Figure 14:
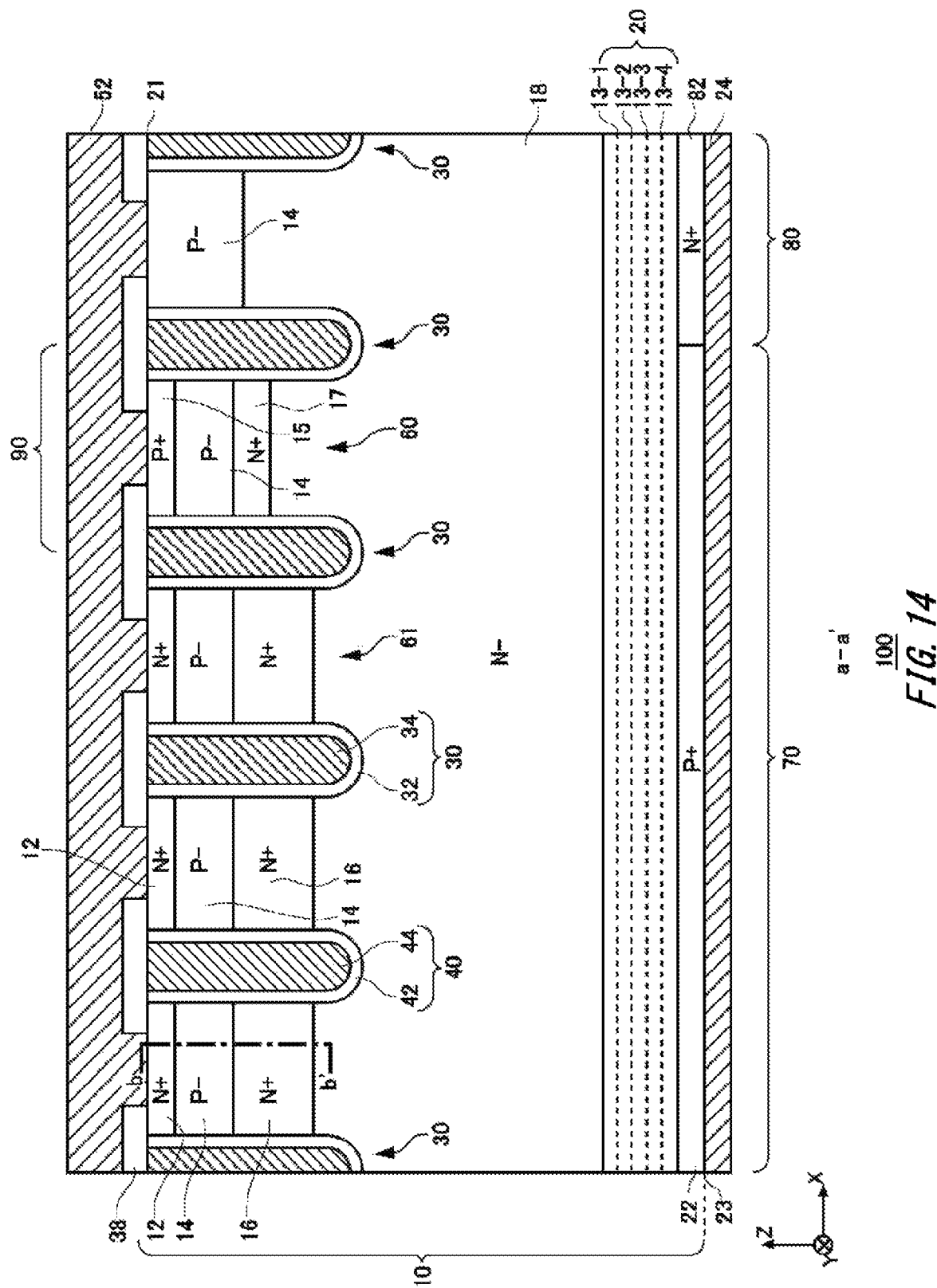
FIG. 14 shows another example of the semiconductor device 100.

FIG. 14 shows another example of the semiconductor device 100. In the present example, the semiconductor device 100 includes an accumulation region 17 in the intermediate mesa part 60. The other structures are the same as the semiconductor device 100 in accordance with one of the aspects described with reference to FIGS. 1 to 13.

The accumulation region 17 is provided between the base region 14 and the drift region 18. The accumulation region 17 may have the same doping concentration distribution as the accumulation region 16, and may have a full width at half maximum smaller than the full width at half maximum of the doping concentration distribution in the accumulation region 16. As an example, the full width at half maximum of the doping concentration distribution in the accumulation region 17 is smaller than 2.2 times the standard full width at half maximum. By the above structure, it is possible to gradually change the length of the accumulation region in the depth direction in the X-axis direction. For this reason, it is possible to reduce the electric field concentration. Also, the accumulation region 17 of the intermediate mesa part 60 is provided shallow, so that it is possible to prevent hole extraction in the intermediate mesa part 60 from being hindered.

Figure 15:
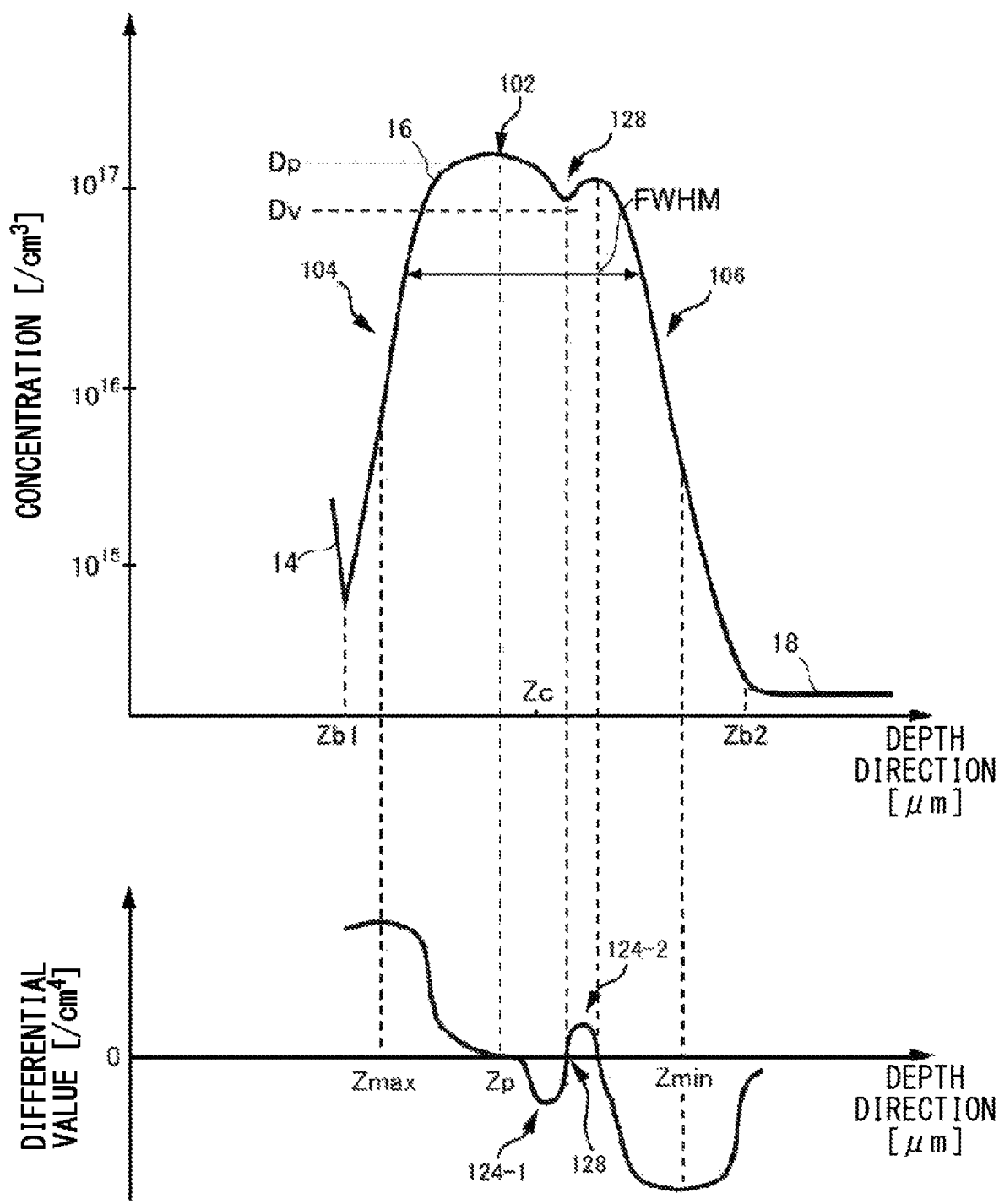
FIG. 15 shows another example of the doping concentration distribution in the accumulation region 16.

FIG. 15 shows another example of the doping concentration distribution in the accumulation region 16. The accumulation region 16 described with reference to FIGS. 1 to 14 has no valley portion 128 in the doping concentration distribution. However, the accumulation region 16 shown in FIG. 15 has a valley portion 128 in the doping concentration distribution. The valley portion 128 may also be provided in the doping concentration distributions of all the aspects described with reference to FIGS. 1 to 15. In the example of FIG. 15, the valley portion 128 is provided, instead of the kink portion 122 in the doping concentration distribution of FIG. 11.

The valley portion 128 refers to a region in which a sign of a gradient (differential value) of the doping concentration distribution changes from negative to positive, when seeing the doping concentration distribution in the accumulation region 16 in a direction from the base region 14 toward the drift region 18. In the present example, the differential value has a negative extreme value 124-1 and the differential value has a positive extreme value 124-2 at predetermined positions between the depth positions Zmax and Zmin. The valley portion 128 may refer to a region, in which the differential value intersects zero (0), between the extreme value 124-1 and the extreme value 124-2.

The valley portion 128 is provided, so that a slope of the gradient portion of the doping concentration distribution is partially reduced. Therefore, it is possible to easily increase the full width at half maximum FWHM. The valley portion 128 may be provided at one or both of the upper gradient portion 104 and the lower gradient portion 106. Also, both the valley portion 128 and the kink portion 122 may be provided. As an example, the valley portion 128 may be formed by setting the distance between the respective ranges Rp shown in FIG. 7 to a predetermined distance or greater.

One of the maximum portion 102 and the valley portion 128 may be arranged in a region above the central position Zc of the accumulation region 16 in the depth direction, and the other of the maximum portion 102 and the valley portion 128 may be arranged in a region below the center of the accumulation region 16 in the depth direction. In the present example, a center between the boundary position Zb1 and the boundary position Zb2 is set as the central position Zc of the accumulation region 16. The boundary position Zb1 is a boundary position between the accumulation region 16 and the base region 14. The boundary position Zb2 is a boundary position between the accumulation region 16 and the drift region 18. In the present example, the maximum portion 102 is arranged in the upper region from the central position Zc to the boundary position Zb1, and the valley portion 128 is arranged in the lower region from the central position Zc to the boundary position Zb2. With the above structure, it is possible to easily increase the full width at half maximum FWHM.

Also, a doping concentration Dv at the valley portion 128 may be 1/10 of the doping concentration Dp at the maximum portion 102 or greater. The doping concentration Dv of the valley portion 128 is set to a concentration relatively close to the doping concentration Dp of the maximum portion 102, so that it is possible to expand a region in which the doping concentration is high. he doping concentration Dv may be 1/5 or 1/2 of the doping concentration Dp or greater.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . semiconductor substrate, 11 . . . well region, 12 . . . emitter region, 13 . . . peak, 14 . . . base region, 15 . . . contact region, 16 . . . accumulation region, 17 . . . accumulation region, 18 . . . drift region, 19 . . . chemical concentration distribution, 20 . . . buffer region, 21 . . . upper surface, 22 . . . collector region, 23 . . . lower surface, 24 . . . collector electrode, 25 . . . connection portion, 29 . . . extension portion, 30 . . . dummy trench part, 31 . . . edge portion, 32 . . . dummy insulating film, 34 . . . dummy conductive portion, 38 . . . interlayer insulating film, 39 . . . extension portion, 40 . . . gate trench part, 41 . . . edge portion, 42 . . . gate insulating film, 44 . . . gate conductive portion, 48 . . . gate runner, 49 . . . contact hole, 50 . . . gate electrode, 52 . . . emitter electrode, 54 . . . contact hole, 56 . . . contact hole, 60 . . . intermediate mesa part, 61 . . . mesa part, 70 . . . transistor section, 80 . . . diode section, 82 . . . cathode region, 90 . . . intermediate region, 92, 93 . . . waveform, 100 . . . semiconductor device, 102 . . . maximum portion, 104 . . . upper gradient portion, 106 . . . lower gradient portion, 108 . . . distribution, 110, 112, 113, 114 . . . curve, 122 . . . kink portion, 124 . . . extreme value, 126 . . . position, 128 . . . valley portion, 160 . . . distribution, 200 . . . Comparative Example

What is claimed is:

1. A semiconductor device comprising:
a semiconductor substrate having a first conductivity-type drift region;
a first conductivity-type emitter region provided above the drift region in the semiconductor substrate and having a doping concentration higher than that of the drift region;
a second conductivity-type base region provided between the emitter region and the drift region in the semiconductor substrate;
a first conductivity-type accumulation region provided between the base region and the drift region in the semiconductor substrate and having a doping concentration higher than that of the drift region; and
a plurality of trench parts formed to penetrate the emitter region, the base region and the accumulation region from an upper surface of the semiconductor substrate and each having a conductive portion provided therein, wherein:

a doping concentration distribution in the accumulation region in a depth direction of the semiconductor substrate has:
   a maximum portion at which the doping concentration reaches a maximum value at a depth position Zp;
   an upper gradient portion in which the doping concentration has a gradient to decrease in at least a part of a region from the maximum portion to the base region as moving toward the base region; and
   a lower gradient portion in which the doping concentration has a gradient to decrease in at least a part of a region from the maximum portion to the drift region as moving toward the drift region;
   the semiconductor substrate is a silicon substrate and the impurities contained in the accumulation region is phosphorus;
   the following equation is satisfied:

$$y=0.01763x^6-0.11077x^5+0.15065x^4+0.21668x^3-0.30410x^2+0.39392x-0.77003,$$

where x is a common logarithm of the depth position Zp (μm), and y is a common logarithm of a full width at half maximum (μm) of the doping concentration distribution in the accumulation region prior to heat treatment; and
a full width at half maximum of the doping concentration distribution in the accumulation region at the depth position Zp is 2.2 times the full width at half maximum at the depth position Zp or greater of the doping concentration distribution in the accumulation region prior to the heat treatment.

2. The semiconductor device according to claim 1, wherein a sum of a distance from the upper surface of the semiconductor substrate to the maximum portion of the accumulation region and the half width at half maximum of the doping concentration distribution in the accumulation region at the depth position Zp is equal to or smaller than a distance from the upper surface of the semiconductor substrate to a lower end of each trench part in the depth direction of the semiconductor substrate.

3. The semiconductor device according to claim 1, wherein the full width at half maximum of the doping concentration distribution in the accumulation region is 30 times or smaller of the full width at half maximum of the doping concentration distribution in the accumulation region prior to the heat treatment.

4. The semiconductor device according to claim 1, wherein the gradient of the doping concentration in the upper gradient portion in the accumulation region decreases in an entire region from the maximum portion to the base region as moving toward the base region.

5. The semiconductor device according to claim 1, wherein the gradient of the doping concentration in the lower gradient portion in the accumulation region decreases in an entire region from the maximum portion to the drift region as moving toward the drift region.

6. The semiconductor device according to claim 1, wherein the accumulation region and the base region are in contact with each other.

7. The semiconductor device according to claim 1, wherein a distance from a first depth position at which a ratio of a doping concentration to a doping concentration of the maximum portion is ¼, to a second depth position at which the ratio is 1/40 in the upper gradient portion of the doping concentration distribution in the accumulation region, is between 0.1 μm and 1.0 μm, inclusive.

8. The semiconductor device according to claim 1, wherein a ratio of the full width at half maximum of the doping concentration distribution in the accumulation region to a full width at 1% of maximum of the doping concentration in the accumulation region is greater than 0.26.

9. The semiconductor device according to claim 1, wherein the full width at half maximum of the doping concentration distribution in the accumulation region is three times or greater the full width at half maximum of the doping concentration distribution in the accumulation region prior to the heat treatment.

* * * * *